(12) United States Patent
Kurihara et al.

(10) Patent No.: US 8,674,588 B2
(45) Date of Patent: Mar. 18, 2014

(54) ELECTRIC POWER GENERATION DEVICE, ELECTRIC POWER GENERATION METHOD, AND ELECTRIC POWER GENERATION DEVICE MANUFACTURING METHOD

(75) Inventors: Kazuaki Kurihara, Kawasaki (JP); Masaharu Hida, Kawasaki (JP); Kazunori Yamanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/570,638

(22) Filed: Aug. 9, 2012

(65) Prior Publication Data

US 2012/0298165 A1 Nov. 29, 2012

Related U.S. Application Data

(63) Continuation of application No. PCT/JP2010/004605, filed on Jul. 15, 2010.

(30) Foreign Application Priority Data

Feb. 26, 2010 (JP) ................................. 2010-041407
Mar. 24, 2010 (JP) ................................. 2010-067374

(51) Int. Cl.
*H02N 2/18* (2006.01)
*H01L 41/113* (2006.01)

(52) U.S. Cl.
CPC ............ *H01L 41/1134* (2013.01); *H02N 2/186* (2013.01)
USPC ........................................ 310/339; 310/306

(58) Field of Classification Search
CPC ..... H01L 41/1134; H01L 41/39; H01L 35/32; H02N 2/186
USPC .................................. 310/339, 306
See application file for complete search history.

(56) References Cited

U.S. PATENT DOCUMENTS 6,274,803 B1 8/2001 Yoshioka
6,340,787 B1 * 1/2002 Simeray et al. ............... 136/201
(Continued)

FOREIGN PATENT DOCUMENTS

DE 10 2008 000 402 A1 9/2008
JP H4-85973 3/1992
(Continued)

OTHER PUBLICATIONS

International Search Report for International Application No. PCT/JP2010/004605 dated Oct. 12, 2010.
(Continued)

*Primary Examiner* — J. San Martin
(74) *Attorney, Agent, or Firm* — Kratz, Quintos & Hanson, LLP

(57) ABSTRACT

An electric power generation device equipped with an apparatus which vibrates and generates heat includes a thermoelectric power generation module and a piezoelectric power generation module which are formed integrally. The thermoelectric power generation module has a first surface combining thermally and mechanically with the apparatus's outer surface and a second surface opposite to the first surface, and generates electric power from temperature differences between the first surface and the second surface caused by the apparatus's generating heat. The piezoelectric power generation module has a fixed end combining mechanically with the apparatus's outer surface and a movable end opposite to the fixed end, and generates electric power from displacement of the movable end to the fixed end caused by the apparatus's vibrating.

18 Claims, 24 Drawing Sheets

(56) References Cited

U.S. PATENT DOCUMENTS

| | | | |
|---|---|---|---|
| 7,235,914 B2 * | 6/2007 | Richards et al. | 310/328 |
| 7,453,187 B2 * | 11/2008 | Richards et al. | 310/339 |
| 7,800,278 B2 * | 9/2010 | Ujihara et al. | 310/306 |
| 7,834,483 B2 * | 11/2010 | Kearney-Fischer et al. | 307/115 |
| 8,207,653 B2 * | 6/2012 | Kurihara et al. | 310/339 |
| 8,319,402 B1 * | 11/2012 | Churchill et al. | 310/339 |
| 8,415,859 B2 * | 4/2013 | Lee | 310/339 |
| 8,482,148 B2 * | 7/2013 | Kobayashi | 290/55 |
| 2003/0057560 A1 * | 3/2003 | Tatoh et al. | 257/773 |
| 2006/0201161 A1 * | 9/2006 | Hirai et al. | 62/3.2 |
| 2012/0228992 A1 * | 9/2012 | Skotnicki | 310/306 |

FOREIGN PATENT DOCUMENTS

| | | | | |
|---|---|---|---|---|
| JP | H6-264862 | | 9/1994 | |
| JP | H7-49388 | | 2/1995 | |
| JP | H8-32128 | | 2/1996 | |
| JP | H11-97750 | | 4/1999 | |
| JP | 2000-012916 | | 1/2000 | |
| JP | 2000-12916 | | 1/2000 | |
| JP | 2001-119076 A1 | | 4/2001 | |
| JP | 2002050727 A | * | 2/2002 | H01L 23/38 |
| JP | 2002151873 A | * | 5/2002 | H05K 7/20 |
| JP | 2005-26473 A1 | | 1/2005 | |
| JP | 2006-207428 A1 | | 8/2006 | |
| JP | 2006-216806 A1 | | 8/2006 | |
| JP | 2008-210988 A1 | | 9/2008 | |
| JP | 2008-288283 A1 | | 11/2008 | |
| JP | 2010026742 A | * | 2/2010 | |

OTHER PUBLICATIONS

Notice of Reason of Rejection mailed Jan. 7, 2014 issued in counterpart application No. 2012-501535 with English translation.

* cited by examiner

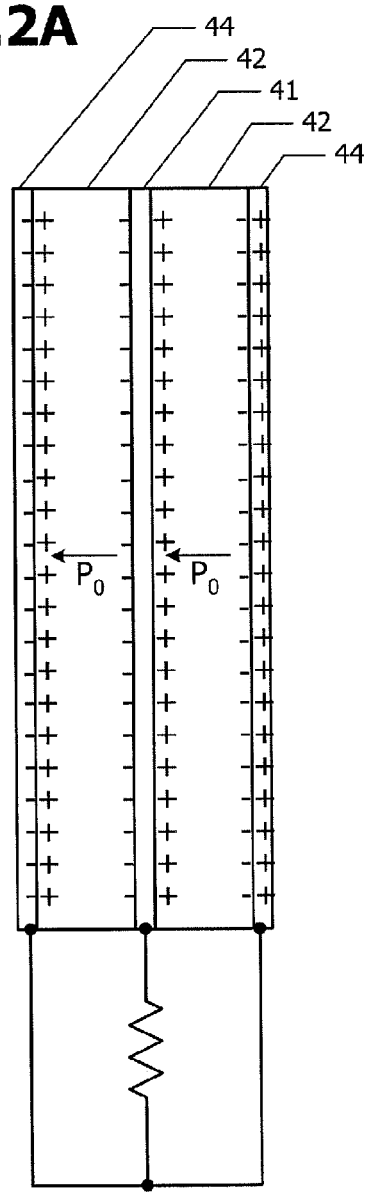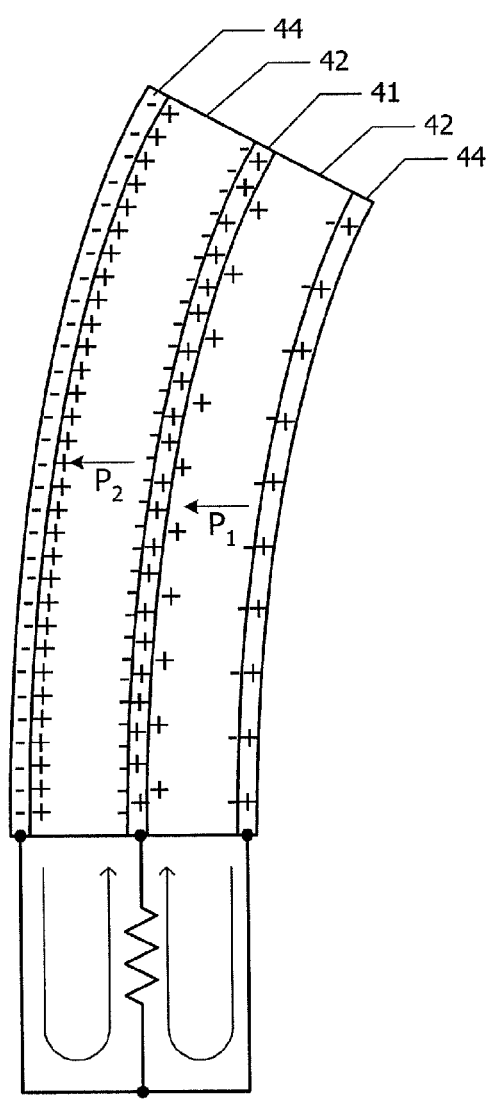
$P_2 > P_0 > P_1$

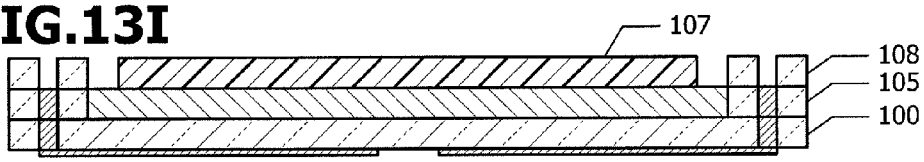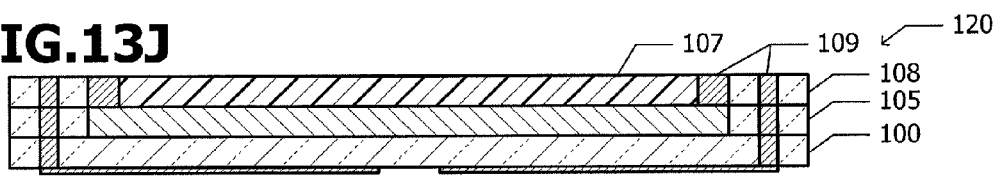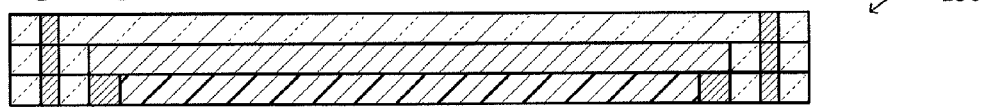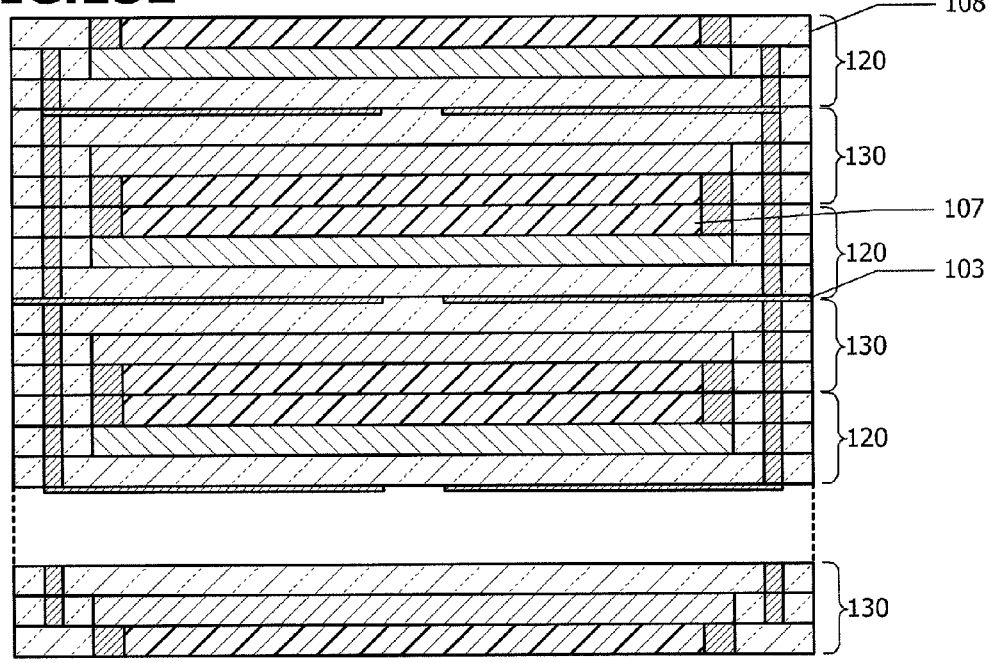

ELECTRIC POWER GENERATION DEVICE, ELECTRIC POWER GENERATION METHOD, AND ELECTRIC POWER GENERATION DEVICE MANUFACTURING METHOD

CROSS REFERENCE TO RELATED APPLICATION

This application is a continuation application of an International Patent application PCT/JP2010/004605, filed in Japan on Jul. 15, 2010, the whole contents of which are incorporated herein by reference.

BACKGROUND

1. Field

The embodiments discussed herein are related to an electric power generation device using thermoelectric conversion and piezoelectric conversion, to a pertinent electric power generation method, and to a pertinent electric power generation device manufacturing method.

2. Related Art

Efforts have been made to promote the development of a sensor network containing sensor modules that integrate sensors, a data processing function, and a radio communication function provided on a network. It is desired that such sensor modules perform self-generation without using a battery. For self-generation, studies are being made of electric power generation methods which use on-site environments and serve to provide miniaturized devices, such as methods using solar cell power generation, thermoelectric power generation, and piezoelectric power generation. Miniaturization of electric power generation devices are desired also for securing wide application ranges.

A unimorph type piezoelectric element is known which contains a piezoelectric capacitor including a lower electrode made of Pt or the like, a piezoelectric layer made of PZT or the like, and an upper electrode made of Al or the like and formed on the upper surface of a cantilever structure comprising a silicon layer or the like. A weight is connected to the movable end of the cantilever.

The electric power generated by a piezoelectric element is too small in quantity to be used as a power supply. Therefore, in many cases, a plurality of piezoelectric elements are connected in parallel to obtain practicable electric power. It is not easy for a large number of cantilever-structured unimorph type piezoelectric elements to be combined in a compact device.

A configuration is disclosed in which a plurality of piezoelectric elements consisting of piezoelectric plates formed on metal plates are laminated on a common support structure and supported in the peripheral portion, with weights applied to the central portions of the piezoelectric elements from a common weight applying means (e.g., Patent Document 1). This configuration is intended to use weights repeatedly applied by traffic of automobiles and railroad trains and accordingly has a structure with high mechanical strength.

The output voltage of a thermoelectric element containing a pair of thermoelectric material articles connected together depends on the temperature difference, but in many cases, the voltage is low, making it necessary to connect a large number of pairs of thermoelectric elements in series in order to obtain a practicable voltage. For example, an output voltage is increased by using a large number of n-type configurations, each consisting of a pair of a p-type semiconductor and an n-type semiconductor arranged adjacently to each other and electrically connected together at one end, that are disposed between a high temperature side and a low temperature side and connected in series. Thermoelectric elements require no movable portion and can be integrated easily. However, it is necessary to insulate adjacent thermoelectric members from one another.

A configuration is proposed wherein, in a structure in which p-type semiconductors and n-type semiconductors are laminated, insulating layers are interposed on lamination interfaces that are other than p-n connections (e.g., Patent Document 2). All layers are laminated in a green state, and are integrally calcined.

There is a proposal for a thermoelectric conversion module composed of a plurality of thermoelectric elements connected in series, with the spaces between thermoelectric elements filled with insulating resin to fix the thermoelectric elements to each other (e.g., Patent Document 3).

There is another proposal for a thermal displacement conversion device that combines a thermoelectric power generation device and a piezoelectric actuator (e.g., Patent Document 4). A thermoelectric element formed of a thermoelectric conversion material generates a voltage which is proportional to an applied temperature, and this voltage causes displacement of the piezoelectric actuator.

PATENT DOCUMENTS

Japanese Laid-open Patent Publication No. 2008-288283 (Patent Document 1)
Japanese Laid-open Patent Publication No. 08-32128 (Patent Document 2)
Japanese Laid-open Patent Publication No. 2001-119076 (Patent Document 3)
Japanese Laid-open Patent Publication No. 06-264862 (Patent Document 4)
Japanese Laid-open Patent Publication No. 04-85973
Japanese Laid-open Patent Publication No. 11-97750
Japanese Laid-open Patent Publication No. 07-49388

SUMMARY

There is a call for a technology to allow thermal, vibrational, or other energy which would be otherwise discarded to be recovered as electrical energy. Development of small size electric power generation devices is also desired.

According to one aspect of the present invention, an electric power generation device equipped with an apparatus which vibrates and generates heat includes:

a thermoelectric power generation module which has a first surface combining thermally and mechanically with the apparatus's outer surface and a second surface opposite to the first surface, and which generates electric power from temperature differences between the first surface and the second surface caused by the apparatus's generating heat; and a piezoelectric power generation module which has a fixed end combining mechanically with the apparatus's outer surface and a movable end opposite to the fixed end, and which generates electric power from displacement of the movable end to the fixed end caused by the apparatus's vibrating;

wherein the thermoelectric power generation module and the piezoelectric power generation module are formed integrally.

According to another aspect of the present invention, an electric power generation method includes:

generating thermoelectric power by equipping a thermoelectric conversion material which is provided with radiation fins with an apparatus which vibrates and generates heat; and generating piezoelectric power from deformation of a piezoelectric conversion material which forms a portion of the radiation fins, the deformation being caused by vibrations of the apparatus.

According to still another aspect of the present invention, an electric power generation device manufacturing method includes:

forming a laminated structure which includes green sheets formed of piezoelectric ceramics, conductive layers, organic resin layers, and support layers, wherein:

the green sheets are disposed at intervals, in a first region pertaining to the in-plane direction of the green sheets, the conductive layers are disposed on both surfaces of each of the green sheets, and the organic resin layers are inserted between the conductive layers, in a second region different from the first region, the support layers are deposited between the green sheets; and calcining the laminated structure to form piezoelectric material plates from the green sheets, and to remove the organic resin layers and form gaps between the piezoelectric material plates with remaining the support layers.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 2 is a diagram illustrating bent states of polarization.

DESCRIPTION OF THE PREFERRED EMBODIMENTS

Embodiment 1

Figure 1:
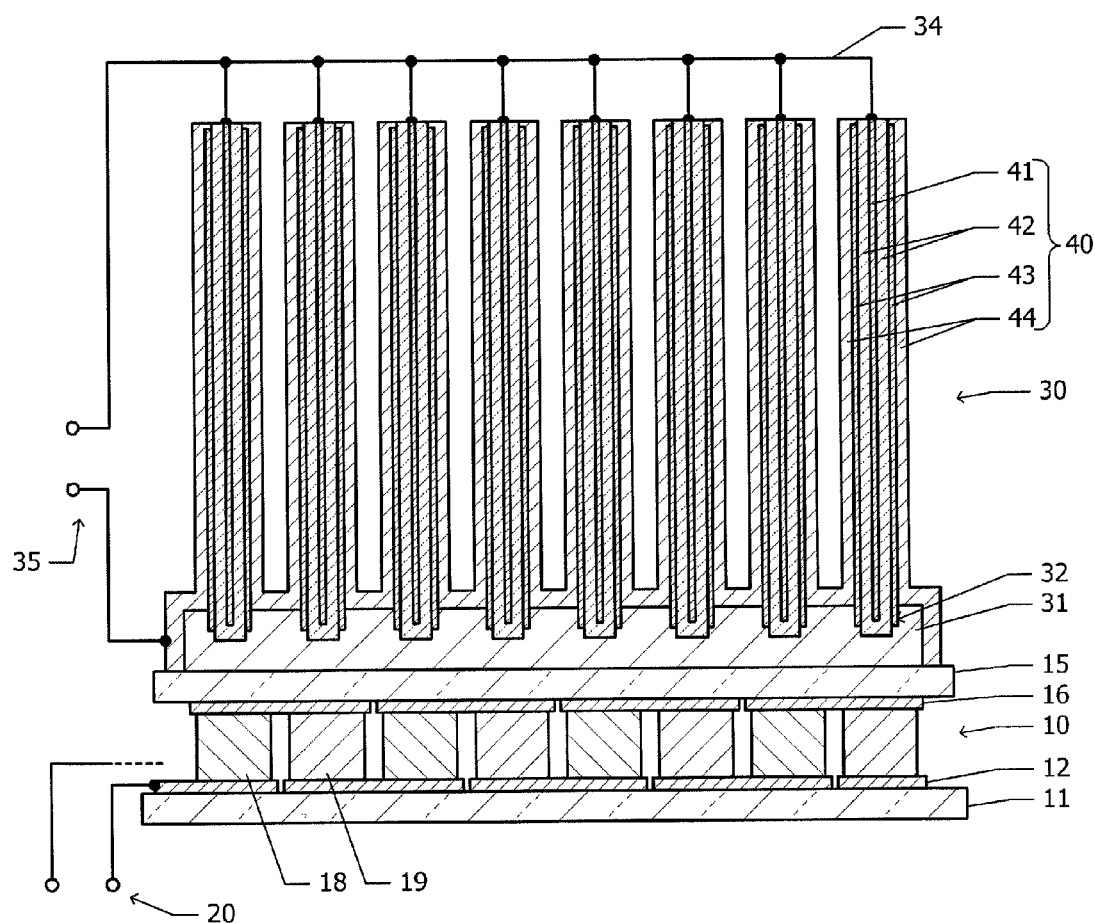
FIG. 1 is a cross-sectional view of an electric power generation device based on Embodiment 1.

FIG. 1 illustrates a cross-sectional view of an electric power generation device based on Embodiment 1. The electric power generation device based on Embodiment 1 includes a thermoelectric power generation section (thermoelectric power generation module) 10 and a piezoelectric power generation section (piezoelectric power generation module) 30.

Hereinafter, an explanation will be made of the configuration of the thermoelectric power generation section 10. A plurality of p-type thermoelectric conversion members 18 and n-type thermoelectric conversion members 19 are held between a first substrate 11 and a second substrate 15. Each of the p-type thermoelectric conversion members 18 and each of the n-type thermoelectric conversion members 19 are connected to the first substrate 11 through first conductive patterns 12 and are connected to the second substrate 15 through second conductive patterns 16. The plurality of p-type thermoelectric conversion members 18 and n-type thermoelectric conversion members 19 are alternately connected in series by first connective patterns 12 and second connective patterns 16. A power takeoff terminal 20 is connected to both ends of this series circuit.

An insulating material with excellent thermal conductivity, such as alumina, is used for the first substrate 11 and the second substrate 15. Silver, for example, is used for the first conductive pattern 12 and the second conductive pattern 16. $Ca_3Co_4O_9$ and $Ca_{0.9}La_{0.1}MnO_3$, for example, are used for the p-type thermoelectric conversion members 18 and the n-type thermoelectric conversion members 19, respectively. As an example, the shape of each of the p-type thermoelectric conversion members 18 and each of the n-type thermoelectric conversion members 19 is a cube with a side length of 2 mm.

The configuration of this thermoelectric power generation section 10 is a so-called n-type structure wherein p-type thermoelectric conversion members and n-type thermoelectric conversion members are connected in series. A thermoelectric module with another structure may be adopted for the thermoelectric power generation section 10.

In the next place, an explanation will be made of the configuration of the piezoelectric power generation section 30. A seat 31 is joined to the second substrate 15 of the thermoelectric power generation section 10, and is thermally connected to the second substrate 15. A material with excellent thermal conductivity, such as aluminum, is used for the seat 31. On the surface of the seat 31, there are formed a plurality of grooves 32 which are disposed in parallel to one another. One end of each of heat exchange fins 40 is inserted into one of the grooves 32, and is fixed thereto. A plurality of fins 40 are arranged in parallel to one another.

Each of the fins 40 includes an inside conductive film 41, two thermoelectric material plates 42, two base conductive films 43, and two outside conductive films 44. The inside conductive film 41 is held between the two thermoelectric material plates 42. At the edge which is fixed to the seat 31, the thermoelectric material plates 42 are in direct contact with each other, and the inside conductive film 41 is not exposed to the end face. That is, the inside conductive film 41 is electrically insulated from the seat 31. A laminated structure which includes the inside conductive film 41 and the two thermoelectric material plates 42, is held between the outside conductive films 44. Base conductive films 43 are disposed between the thermoelectric material plates 42 and the outside conductive films 44.

The outside conductive films 44 continuously cover areas extending from the surfaces of the thermoelectric material plates 42 to the surface of the seat 31. Therefore, a pair of outside conductive films 44, between which is held the laminated structure that includes the inside conductive film 41 and the two thermoelectric material plates 42, are electrically short-circuited through the seat 31. Furthermore, the outside conductive films 44 are thermally connected to the second substrate 15 through the seat 31. The heat of the second substrate 15 is transferred to the outside conductive films 44 via the seat 31, and is further radiated to the surrounding space.

Platinum (Pt), for example, is used for the inside conductive film 41 and the base conductive films 43. A piezoelectric material such as lead zirconate titanate (PZT) or lead lanthanum zirconate titanate (PLZT) is used for the thermoelectric material plates 42. In this regard, it is preferable to use an oxide piezoelectric material as a piezoelectric material. Polarization treatment is performed on the thermoelectric material plates 42 so that spontaneous polarizations will be oriented in the thickness direction. Thermoelectric material plates 42 of a plurality of fins 40, which are arranged in parallel, are disposed in such an attitude that the residual polarizations of the thermoelectric material plates 42 will be oriented in the same direction.

The inside conductive films 41 are exposed to the end faces of the tips (the edges opposite to the edges which are fixed to the seat 31) of the fins 40. A lead cable 34 is connected to the inside conductive films 41, which are exposed to the end faces. The lead cable 34 and the outside conductive films 44 are connected to a power takeoff terminal 35.

Hereinafter, an explanation will be made of the operation of the electric power generation device based on Embodiment 1. The first substrate 11 is mounted on a device which generates heat and vibrations, such as an internal combustion engine. The temperature of the first substrate 11 rises due to the heat transferred from the device which generates heat and vibrations. The heat which is transferred to the second substrate 15 is radiated to the outside via the heat exchange fins 40. Due to the above, temperature differences occur between both ends of each of the p-type thermoelectric conversion members 18 and each of the n-type thermoelectric conversion members 19. Due to these temperature differences, a voltage is generated in the terminal 20, and is taken out as electric power.

The fins 40 vibrate due to the vibrations of the device which generates heat and vibrations. Fins 40 undergo bending vibrations in a way that the edges fixed to the seat 31 serve as fixed ends and that the opposite edges serves as free ends. Due to these bending vibrations, strains are generated in the thermoelectric material plates 42, and potential differences occur between the inside conductive films 41 and the outside conductive films 44. These potential differences are taken out, as electric power, to the outside through the terminal 35.

FIG. 2 illustrates the polarization states of piezoelectric material plates 42 and the states of electric charges generated. Residual polarizations $P_0$ which are in the same direction remain in two piezoelectric material plates 42, between which an inside conductive film 41 is held. If this fin is bent, an in-plane tensile stress acts on the piezoelectric material plate 42 which is on the outside of bending, and a compressive stress acts on the piezoelectric material plate 42 which is on the inside. Due to these stresses, electric charges are generated on the surface of each of the piezoelectric material plates 42. The electric charges generated on the convex side surfaces of the two bent piezoelectric material plates 42 have mutually reverse polarities. The electric charges generated on the concave side surfaces also have mutually reverse polarities. Consequently, the electric charges generated on the surface on the side of the inside conductive film 41 also have the same polarity, and the electric charges generated on the surfaces on the side of the outside conductive films 44 also have the same polarity. Due to these electric charges, an electromotive force is generated between the inside conductive film 41 and the outside conductive films 44.

In the next place, by making reference to FIG. 3A to FIG. 3J, an explanation will be made of a method of manufacturing the electric power generation device based on Embodiment 1.

Figure 3A:
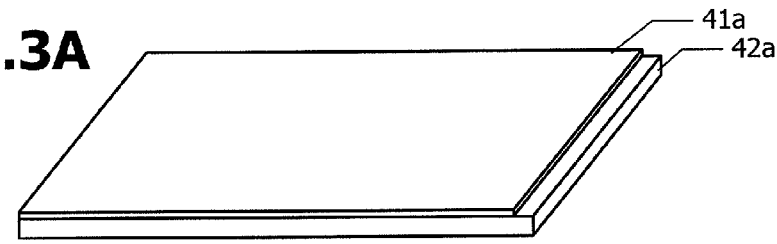
FIG. 3A to FIG. 3D are perspective views of a fin in intermediate stages of manufacturing an electric power generation device based on Embodiment 1.

As illustrated in FIG. 3A, a PZT-based ceramic green sheet 42a is made ready. The thickness of the green sheet 42a is 50-70 μm, for example. Platinum (Pt) paste is printed on the surface of the green sheet 42a, resulting in a Pt paste film 41a being formed. An exposed portion with no Pt paste printed is secured in that portion of the green sheet 42a which abuts an edge (a region extending from the edge to a position slightly inward thereof).

Figure 3B:
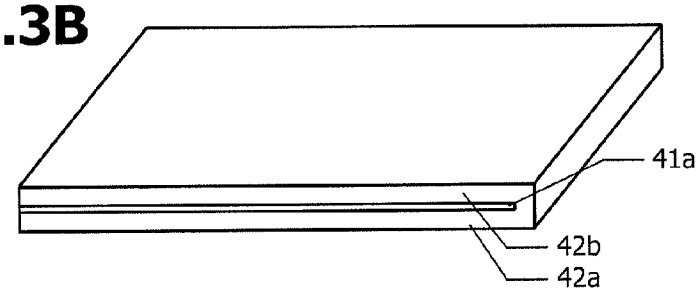

As illustrated in FIG. 3B, another green sheet 42b is placed on top of the Pt paste film 41a. The green sheet 42a and the green sheet 42b are brought into direct contact with each other in the exposed portion to which no Pt paste is applied. This three-layer structure is degreased at 500° C., and is subsequently calcined at 1,200° C.

Figure 3C:
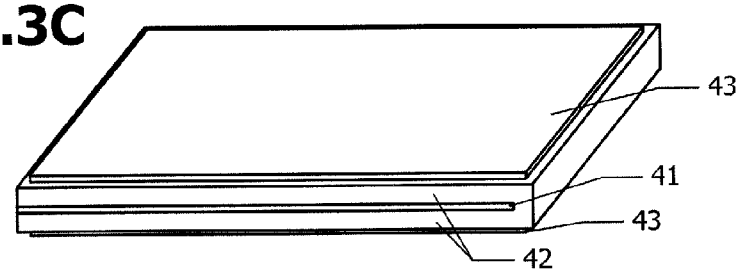

As illustrated in FIG. 3C, due to calcination, there are obtained an inside conductive film 41 formed of Pt, and piezoelectric plates 42 on both sides thereof. Pt past is printed on the outer surfaces of the piezoelectric plates 42, resulting in Pt paste films being formed. These Pt paste films are calcined at 1,200° C., with the result that base conductive films 43 formed of Pt are obtained.

Figure 3D:
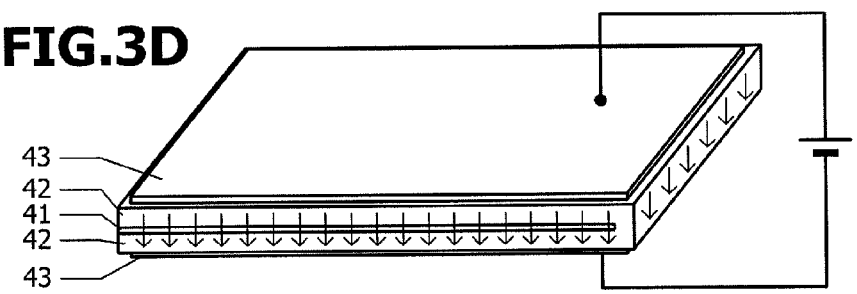

As illustrated in FIG. 3D, polarization treatment is applied by imposing an alternating current voltage between the base conductive films 43. Due to the above, residual polarizations occur in the piezoelectric material plates 42. The laminated body illustrated in FIG. 3D is cut off to a predetermined size.

Figure 3E:
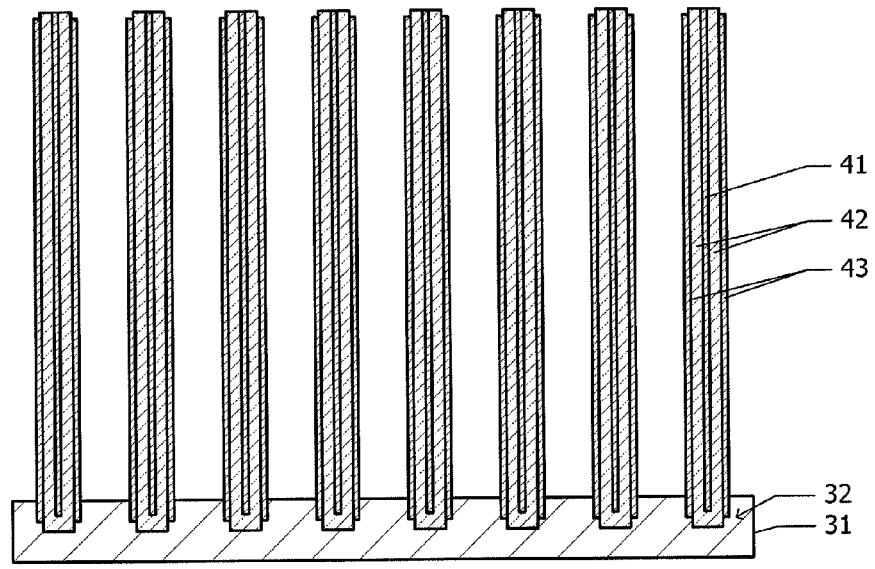
FIG. 3E to FIG. 3H are cross-sectional views of a piezoelectric generation section in intermediate stages of manufacturing the electric power generation device based on Embodiment 1.

As illustrated in FIG. 3E, that edge of each of the laminated bodies illustrated in FIG. 3D to which an inside conductive film 41 is not exposed, is inserted into one of the grooves 32 formed in the seat 31.

Figure 3F:
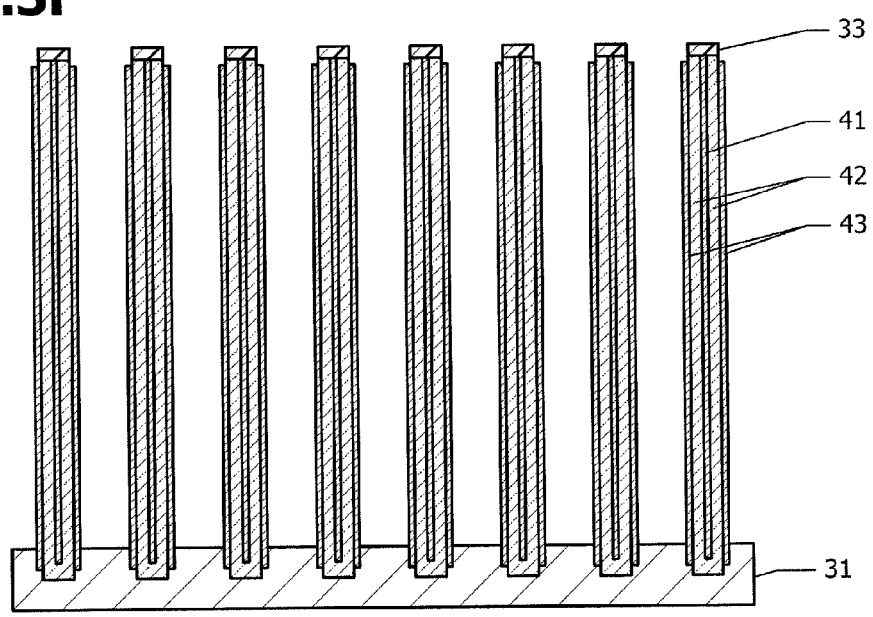

As illustrated in FIG. 3F, the edges to which inside conductive films 41 are not exposed, are covered with mask films 33 made of resist or the like.

Figure 3G:
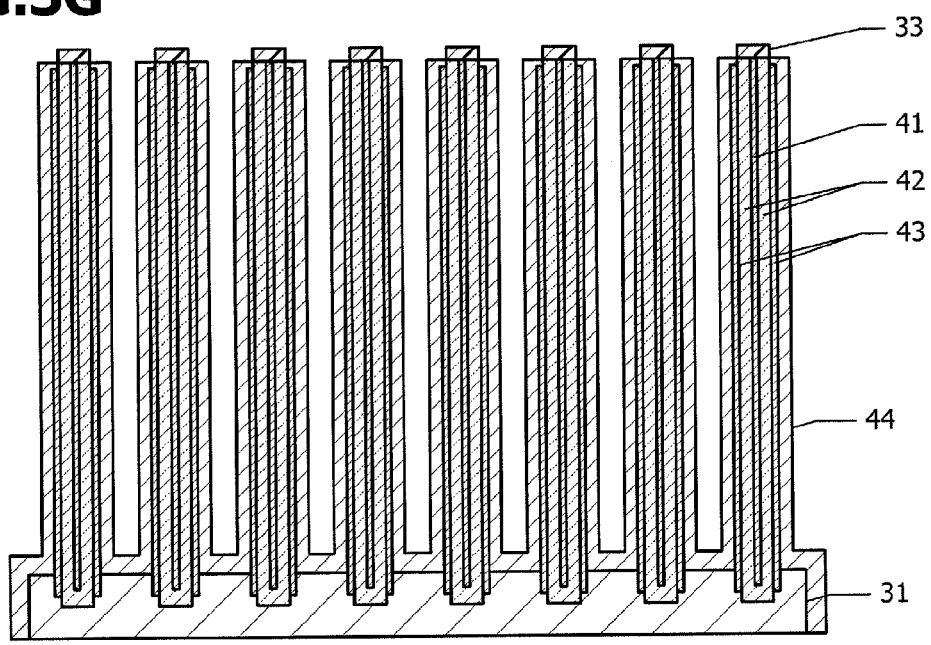

As illustrated in FIG. 3G, outside conductive films 44 are formed by applying aluminum plating to the surfaces of the base conductive films 43 and the seat 31. Due to the above, the piezoelectric material plates 42 are fixed to the seat 31 at one end of each of the piezoelectric material plates 42.

Figure 3H:
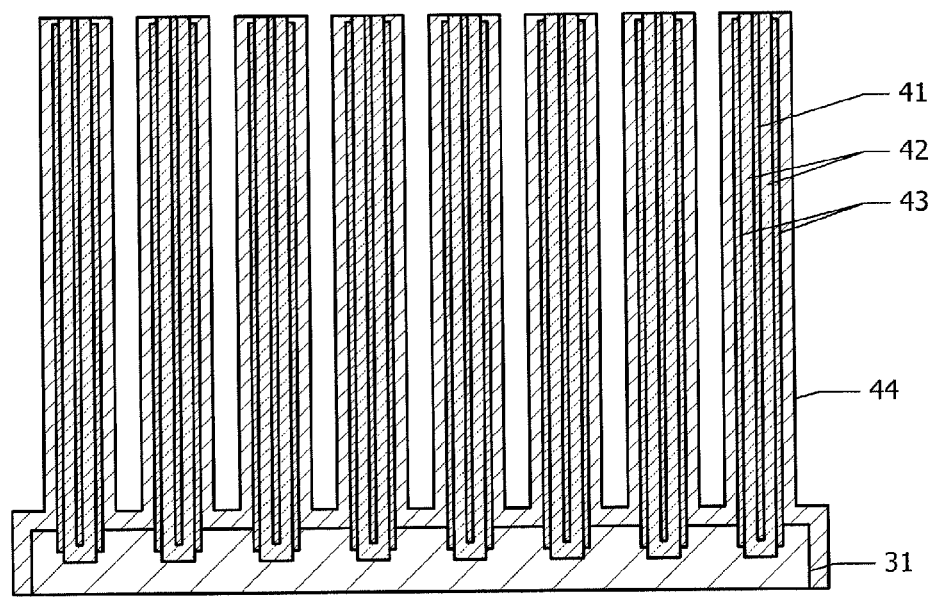

As illustrated in FIG. 3H, the mask films 33 (FIG. 3G) are removed. Due to the above, the inside conductive films 41 are exposed to the end faces at the tips.

Figure 3I:
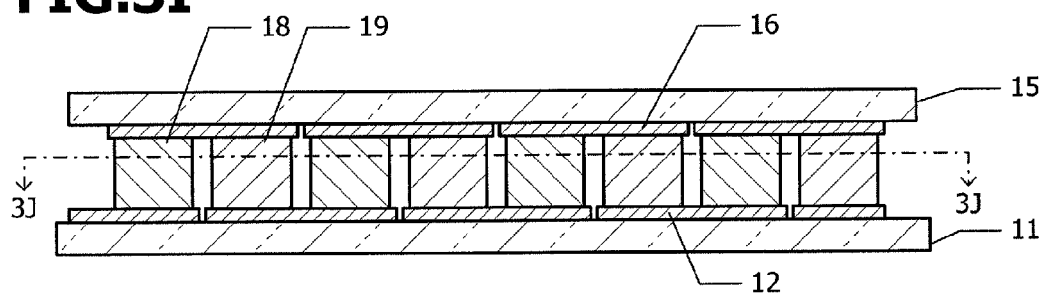
FIG. 3I to FIG. 3J are cross-sectional views of a thermoelectric generation section in intermediate stages of manufacturing the electric power generation device based on Embodiment 1.

As illustrated in FIG. 3I, first conductive patterns 12 are formed on the surface of a first substrate 11, and second conductive patterns 16 are formed on the surface of a second substrate 15. Using an electrically conductive adhesive such as Ag paste, p-type thermoelectric conversion members 18 and n-type thermoelectric conversion members 19 are bonded to the first conductive patterns 12. The second substrate 15 is placed on top of the p-type thermoelectric conversion members 18 and the n-type thermoelectric conversion members 19. Using an electrically conductive adhesive such as Ag paste, the p-type thermoelectric conversion members 18 and the n-type thermoelectric conversion members 19 are bonded to the second conductive patterns 16.

Figure 3J:
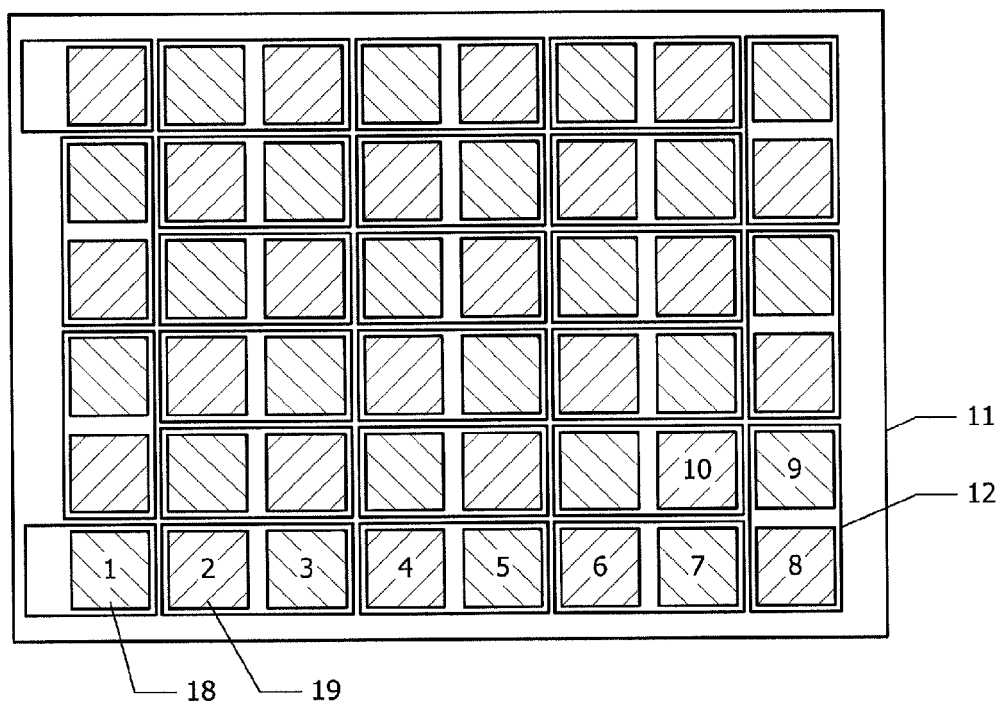

FIG. 3J illustrates a plane cross-sectional view of FIG. 3I through the dashed-dotted line 3J-3J. The p-type thermoelectric conversion members 18 and the n-type thermoelectric conversion members 19 are disposed matrix-wise on the first substrate 11. The p-type thermoelectric conversion members 18 and the n-type thermoelectric conversion members 19 are alternately arranged in both the row direction and the column direction. When sequential numbers are assigned, starting at 1, to series-connected p-type thermoelectric conversion members 18 and n-type thermoelectric conversion members 19 in order of connection, then the first conductive patterns 12 connects the 2i-th n-type thermoelectric conversion members 19 to the (2i+1)-th p-type thermoelectric conversion members 18, where i is a positive integer. In this regard, the second conductive patterns 16 connects the (2i−1)-th p-type thermoelectric conversion members 18 to the 2i-th n-type thermoelectric conversion members 19.

As illustrated in FIG. 1, the seat 31 is bonded to the second substrate 15 using electrically conductive adhesive. By means of wire bonding, the lead cable 34 is connected to the inside conductive films 41, which are exposed to the end faces of the fins 40.

In the electrical power generation device based on Embodiment 1, heat is radiated through the outside conductive films 44 of the fins 40. Thus the outside conductive films 44, which acts as electrodes on one side of the piezoelectric power generation section 30, serves also as heat radiating fins for the thermoelectric power generation section 10.

If electrodes are formed on both surfaces of a piezoelectric material plate, a piezoelectric-effect-caused potential difference occurs between the electrode on one surface and the electrode on the other surface. Consequently, it is impossible to make the two electrodes equipotential. In this structure, it is impossible to bring the two electrodes into contact with a conductive seat. In Embodiment 1, equipotential outside conductive films 44 cover both surfaces of each of the fins 40. Therefore, it is possible to bring the outside conductive films 44 into contact with the conductive seat. Due to the above, it is possible to increase the heat transfer efficiency from the thermoelectric section 10 to the outside conductive films 44.

In Embodiment 1 mentioned above, it is preferable to design the shape and the size of the fins 40 so that the bending vibrations of the fins 40 will resonate with the vibrations of the device on which the Embodiment 1 is mounted.

In Embodiment 1 mentioned above, it is possible to increase the electric power generation efficiency by using thermoelectric power generation and piezoelectric power generation in combination with each other.

Embodiment 2

Figure 4A:
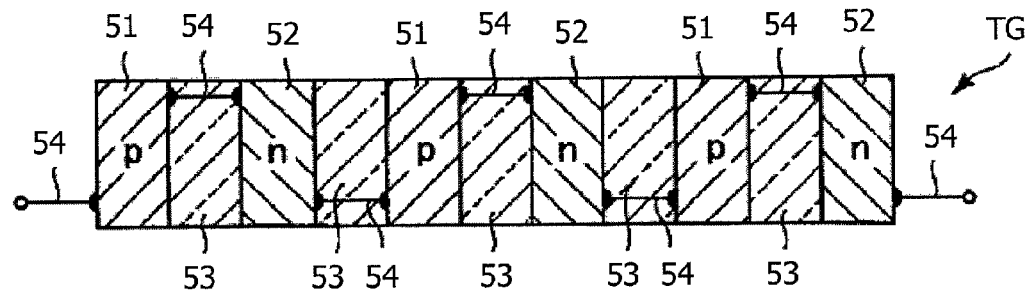
FIG. 4A is a schematic cross-sectional view of a thermoelectric generation element.

As illustrated in FIG. 4A, p-type semiconductor layers (p-type thermoelectric material layers) 51 and n-type semiconductor layers (n-type thermoelectric material layers) 52 are laminated alternately with insulating layers 53 therebetween, resulting in a required electrical connection 54 being formed, with the consequence that a thermoelectric power generation section (thermoelectric power generation module) TG is formed. For example, in FIG. 4A, if the upper side of the thermoelectric power generation section TG is used as a high temperature side, and if the lower side thereof is used as a low temperature side, a carrier is transported from the high temperature upper side to the low temperature lower side. If the p-type semiconductor layers 51 and n-type semiconductor layers 52 are connected together in the high temperature portion, then the low temperature portions of the p-type semiconductor layers 51 are positively charged, and the low temperature portions of the n-type semiconductor layers 52 are negatively charged. If a plurality of pairs (three pairs in FIG. 4A) of thermoelectric elements are connected in series in the low temperature portion, and are connected between output terminals, then a voltage equal to the sum of the output voltages of all thermoelectric elements is generated. In this regard, pairs of p-type semiconductor layers 51 and n-type semiconductor layers 52 do not need to be used as basic configurations of thermoelectric elements. For example, measures may be taken such as providing output terminals in the high temperature portion and the low temperature portion.

Various kinds of materials such as a heavy metal like Bi—Te/PbTe, a silicide like FeSi/MgSi, or an oxide like CaCoO/CaMnO can be used as semiconductor materials (thermoelectric materials). In a case where a material is calcined together with other materials, then an oxide material like CaCoO/CaMnO is suitable. If p-type semiconductor layers 51 and n-type semiconductor layers 52 are prepared in a clayish green state where raw material powder is kneaded together with a binder, a plasticizer, or the like, and are calcined, then thermoelectric material layers can be formed. It is preferable that this material is one together with which insulating layers 53 can also be calcined.

Figure 4B:
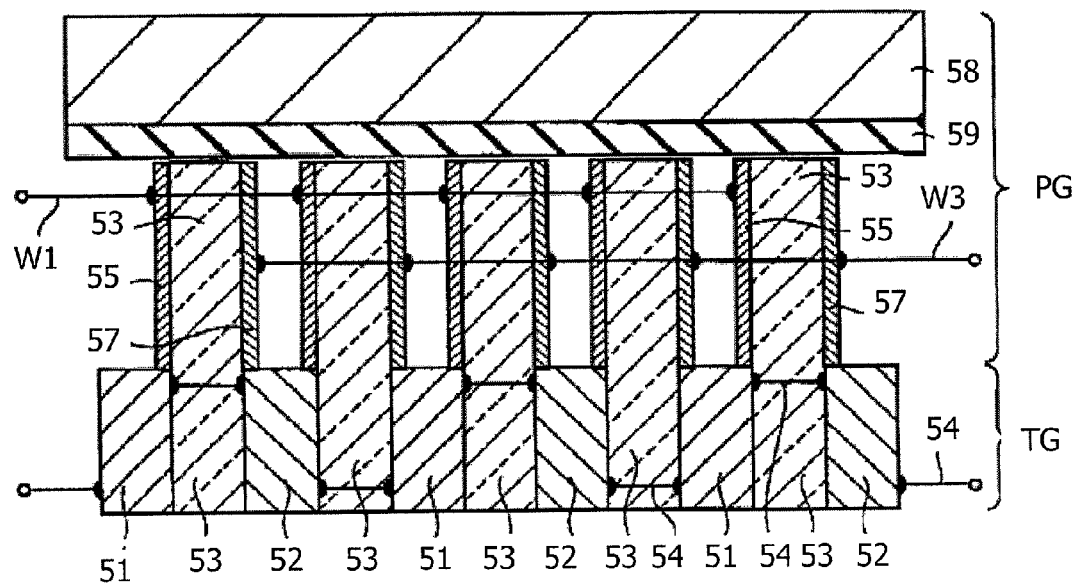
FIG. 4B is a schematic cross-sectional view illustrating a configuration of a piezoelectric-thermoelectric generation device based on Embodiment 2.

As illustrated in FIG. 4B, a piezoelectric power generation section (piezoelectric power generation module) PG is formed on top of the thermoelectric power generation section TG illustrated in FIG. 4A. The piezoelectric power generation section PG has a configuration such that piezoelectric elements wherein electrodes 55 and 57 are formed on both sides of piezoelectric material layers 53 are disposed in parallel at intervals. in the piezoelectric power generation section PG, the electrodes 55, which are located on the left surfaces of the piezoelectric material layers, are connected to each other with a wire W1, and the electrodes 57, which are located on the right surfaces of the piezoelectric material layers, are connected to each other with a wire W3. In a configuration wherein a single piezoelectric material layer is held between a pair of electrodes 55 and 57, a unimorph type piezoelectric element is formed. As will be mentioned later, if a central electrode (inside conductive film) is disposed at the center of a piezoelectric material layer, a bimorph type piezoelectric element is formed. Materials such as lead zirconate titanate (PZT, Pb (Zr—Ti) O$_3$), lead lanthanum zirconate titanate (PLZT, (Pb—La) (Zr—Ti) O$_3$), Nb-added PZT, PNN-PZT (Pb(Ni—Nb)O$_3$—PbTiO$_3$—PbZrO$_3$), PMN-PZT (Pb(Mg—Nb) O$_3$—PbTiO$_3$—PbZrO$_3$), a perovskite oxide like barium titanate, potassium niobate (KNbO$_3$), aluminum nitride (AlN), lithium niobate (LiNbO$_3$), lithium titanate (LiTiO$_3$), or zinc oxide (ZnO) can be used as a piezoelectric material. A perovskite oxide is suitable in a case where a piezoelectric material is integrally calcined together with an oxide type thermoelectric conversion material.

A piezoelectric material is an insulator. By utilizing the insulating properties of the pertinent piezoelectric material, it is possible for insulating layers 53 of the thermoelectric power section TG to be formed of thermoelectric material layers 53. Single layers are caused to extend. Portions thereof, as they are, are used as insulating layers 53. In other portions, electrodes are provided on both surfaces, resulting in piezoelectric elements being able to be formed. The lower ends of the piezoelectric elements are connected to the thermoelectric power generation section TG, thereby forming fixed ends. Thermoelectric material layers 51 and 52 are unnecessary in the thermoelectric power generation section PG, and are removed, resulting in spaces (gap portions) being formed, with the consequence that piezoelectric elements are disposed at intervals. In such an arrangement where the arrangement where piezoelectric material layers of the piezoelectric power generation section PG and the insulating layers 53 of the thermoelectric power generation section TG are caused to become common layers, and where the thermoelectric material layers 51 and 52 of the thermoelectric power generation section TG correspond to the gap portions of the piezoelectric power generation section PG, it follows that the number of insulating layers 53 of the thermoelectric elements corresponds to the number of piezoelectric elements. In FIG. 4B, three pairs of n-type thermoelectric elements are formed. Therefore, the number of insulating layers 53 is five, and the number of piezoelectric element is five. It is possible to arbitrarily change this number of elements.

No particular restrictions are imposed on the materials of electrodes and wires, provided that the materials are insulators. Different materials may be used for electrodes and wires. In a case where electrodes and wires are integrally calcined together with an electrical power generation device, it is preferable that the materials are capable of withstanding integral calcination. For example, Platinum (Pt), nickel (Ni), palladium (Pd), silver-palladium (Ag—Pd), etc. can be mentioned as such materials. In this regard, surface electrodes (outside conductive films) 55 and 57 can also be formed by plating, vapor deposition, sputtering, CVD, or the like subsequent to ceramics calcination. In this case, it is also possible to use metals such as iridium (Ir), chromium (Cr), copper (Cu), titanium (Ti); nitrides such as titanium nitride; carbides such as tungsten carbide (WC); and oxides such as indium tin oxide (ITO). In order to enhance the thermal conductivity for the thermoelectric elements, it is preferable that a material with high thermal conductivity, such as copper or aluminum, is used so as to form large thicknesses.

The upper ends of the piezoelectric elements form movable ends. A weight 58 is connected to the movables ends of the piezoelectric elements via a flexible adhesive layer 59. No particular restrictions are imposed on the material of the weight 58 so long as it has mass. For example, the weight 58 can be formed of a stainless plate. The adhesive layer 59 is formed of elastic silicone resin, for example, and does not fix the weight 58 to the piezoelectric material layers 53, but connects the former to the latter in a state where connection angles can be changed. It is possible for the piezoelectric material layers 53 of the piezoelectric power generation section PG to be deformed arc-wise at an approximately uniform curvature.

If the movable ends of the piezoelectric material layers 53 are fixed to the weight 58, resulting in the connection angle being fixed to 90 degrees for example, then with the movement of the weight 58, the upper side and the lower side of the piezoelectric material layers 53 are bent in opposite directions (in an S-shape), with the result that electric charges are generated in a way that the polarity on the upper side and the polarity on the lower side are reverse to each other, leading to the piezoelectric effect being offset.

Figure 4C:
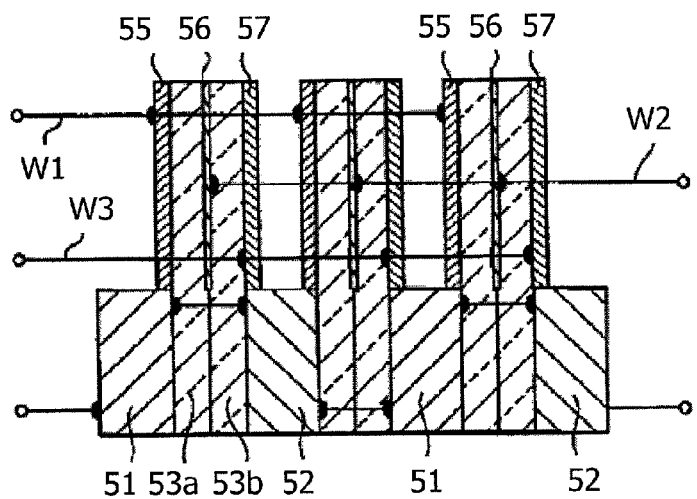
FIG. 4C is a schematic cross-sectional view illustrating another configuration of a piezoelectric-thermoelectric generation device based on Embodiment 2.

FIG. 4C illustrates a case where the piezoelectric elements have a bimorph structure. This structure is such that the piezoelectric material layers 53 are each divided into two layers, which are piezoelectric material layers 53a and 53b, and that these layers are bonded together with a central electrode (inside conductive film) 56 therebetween. Central electrodes 56 are connected to each other with a wire W2. The wire W2, which connects the central electrodes 56, supplies the output of the piezoelectric power generation section PG, together with a wire W1, which mutually connects surface electrodes 55 on the outside of the piezoelectric material layers, and with a wire W3, which mutually connects surface electrodes 57. The piezoelectric material layers 53a and the electrodes 55 and 56 on both sides form left piezoelectric elements, and the piezoelectric material layers 53b and the electrodes 56 and 57 on both sides form right piezoelectric elements. The left piezoelectric elements and the right piezoelectric elements combined form bimorph type piezoelectric elements. Similarly to FIG. 4B, a weight is connected to the movable end to the piezoelectric power generation section with flexible adhesive.

The deformation which occurs in the right piezoelectric element and the deformation which occurs in the left piezoelectric element have reverse properties, such as elongation and contraction. In the case of a bimorph type piezoelectric element, it is preferable that spontaneous polarizations are generated in piezoelectric material layers 53a and 53b. A mode wherein polarizations are generated in the same direction and a mode wherein polarizations are generated in opposite directions are feasible. If the wires W1 and W3 are connected in common, and if a voltage is applied between W2 and the common connection, then in the piezoelectric material layers 53a and 53b, electric fields are generated which are reverse in the thickness direction, and the piezoelectric material layers 53a and 53b are polarized in opposite directions. Piezoelectric material is a ferroelectric as well. Polarization remains even after the applied voltage is removed. If, by being driven by the weight 58, the bimorph type piezoelectric element vibrates and bends, one of the piezoelectric material layers 53a and 53b elongates, and the other contracts. Due to the piezoelectric transverse effect (d31 effect), the generated voltage takes a value which corresponds to the acceleration of the weight 58. The voltage generated between two surface electrodes 55 and 57 turns out to be equal to the sum (total added value) of the voltage generated between both surfaces of the piezoelectric material layer 53a and the voltage generated between both surfaces of the piezoelectric material layer 53b.

If a voltage is applied between the wire W1 and the wire W2, electric fields are applied to the left piezoelectric material layers 53a, resulting in polarizations being generated. In the next place, if a similar voltage is applied between the wire W2 and the wire W3, electric fields are applied to the right piezoelectric material layers 53b, resulting in polarizations being generated in the same direction as polarizations in the piezoelectric material layers 53a. In this case, the voltages generated in two types of surface electrodes 55 and 57 have the same polarity as for the central electrodes 56. If the electrodes 55 and 57 (wires W1 and W3) are jointly connected to one of the output terminals, and if the electrodes 56 (wire W2) is connected to the other output terminal, then the resulting voltage is 50 percent, compared to a reverse-direction type. However, the resulting current is twice as high. Therefore, there is no particular difference in terms of electric power.

In this regard, the surface electrodes 55 and 57 extend from the upper part of the piezoelectric power generation section to the vicinity of the upper ends of the thermoelectric material layers 51 and 52 of the thermoelectric power generation section. Electrical conductors such as metals have not only high electrical conductivity but also high thermal conductivity. If the surface electrodes 55 and 57 are formed of copper, aluminum, or the like, which has high thermal conductivity, and if the thickness of these surface electrodes are made larger than that of the center electrodes 56, which primarily function as electrical conductors, then the surface electrodes 55 and 57 can be provided with not only functions as electrical conductors but also functions as thermal conductors, resulting in improved heat transfer characteristics.

By making reference to FIG. 5A to FIG. 5M, a more specific explanation will be made of a method of the bimorph type piezoelectric-thermoelectric power generation device based on Embodiment 2.

Figure 5A:
FIG. 5A to FIG. 5M are cross-sectional views and top views illustrating main steps in the method of manufacturing a bimorph type piezoelectric-thermoelectric generation device based on Embodiment 2.

As illustrated in FIG. 5A, ceramic green which is prepared by kneading together PZT-based piezoelectric ceramic powder, binder resin, and a plasticizer, is molded, by using a doctor blade, into a ceramic green sheet 63 which is approximately 50 μm thick and whose area is equivalent to approximately 100 mm×100 mm. In this regard, for the purpose of simplifying illustration, a portion where two piezoelectric-thermoelectric power generation devices are disposed opposite to each other is illustrated. In a subsequent process, the ceramic green sheet 63 is divided at the center into the left portion and the right portion, resulting in two electric power generation devices being formed.

Figure 5B:
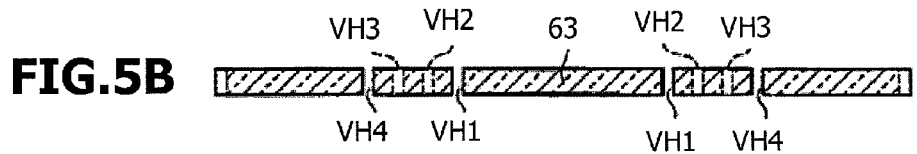

As illustrated in FIG. 5B, 50 μm diameter wiring via holes VH1 to VH4 are punched out by means of a punch. Via holes VH1 for piezoelectric elements and via holes VH4 for thermoelectric elements are illustrated as examples. The via holes for the thermoelectric elements exist in the upper part or the lower part of the thermoelectric material layers 51 and 52 (FIG. 4C). In FIG. 5B, via holes VH4 which are to be disposed on top of thermoelectric material layers are illustrated as examples. However, there are cases where via holes to be disposed in the lower part of the thermoelectric material layers are formed at both ends of the green sheet. Since each bimorph type thermoelectric element includes three electrodes, via holes VH2 and VH3 for other electrodes are also formed.

Figure 5C:
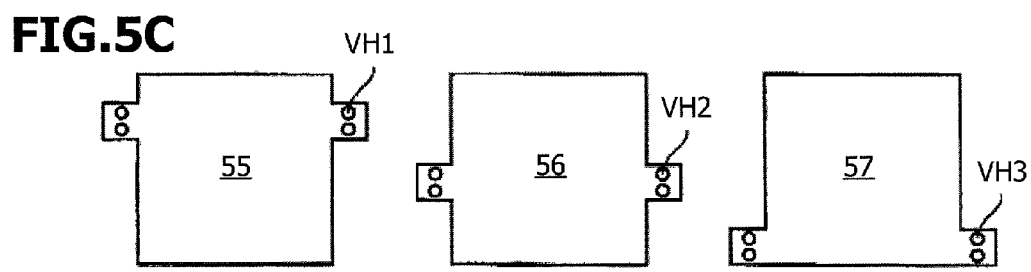

As illustrated in FIG. 5C, a bimorph type piezoelectric element has surface electrodes 55 and 57 on both sides (vertical sides) of a central electrode 56 with piezoelectric material layers in between. Connection wirings can be formed by extending portions of electrodes outward and by disposing via holes VH1, VH2, and VH3 in extension portions.

Figure 5D:
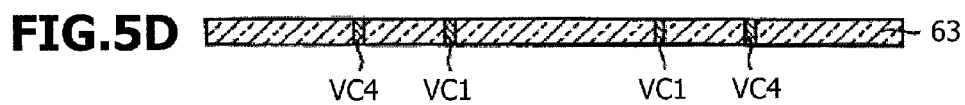

As illustrated in FIG. 5D, the via holes VH1 to VH4 (FIG. 5B) are filled with Ag—Pd paste by means of screen printing, resulting in via conductors VC1 to VC4 being formed. In this regard, neither via conductors VC2 nor conductors VC3 appear in the cross-sectional view in FIG. 5D.

Figure 5E:
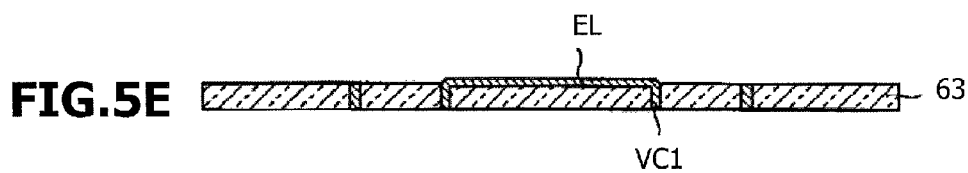

As illustrated in FIG. 5E, by using Ag—Pd paste, an electrode layer EL for the piezoelectric element is formed on the surface of the green sheet 63 by means of screen printing. The electrode layer EL forms one of the electrodes 55, 56, or 57. Here, the surface electrode 55 is illustrated as being formed, for example.

Figure 5F:
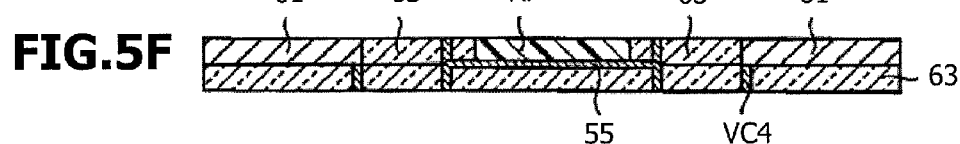

As illustrated in FIG. 5F, by means of screen printing, the following patterns are selectively formed on the green sheet 63, on which the surface 55 electrode is formed: a pattern for piezoelectric material (insulator) paste 63; a pattern for p-type semiconductor thermoelectric material paste 61; a pattern for Ag—Pd paste, which is to be formed in a wiring portion; and a pattern for resin paste RP, which is to be formed in a portion that is to become a vacant space.

Figure 5G:
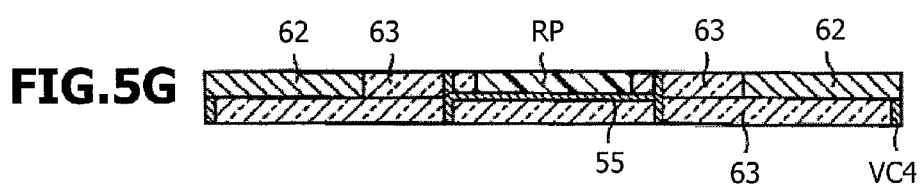

FIG. 5G illustrates a case where an n-type semiconductor thermoelectric material paste 62 is disposed in place of the pattern for p-type semiconductor thermoelectric material paste 61, and where connection wires VC4 in an insulating layer 63 are formed at both ends. It is possible to change wiring patterns through design.

Figure 5H:
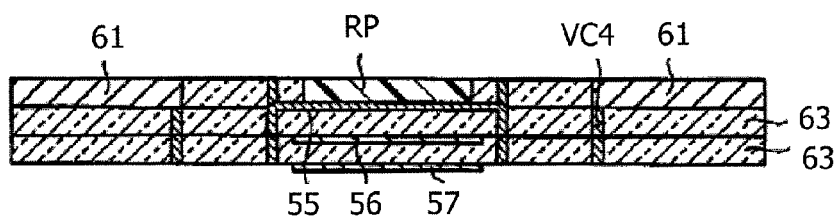

FIG. 5H illustrates a state where a central electrode 56 is formed on the lower surface of the configuration in FIG. 5F, where a piezoelectric material layer green sheet 63 is laminated on the lower surface of a piezoelectric material layer 63 by covering the central electrode 56, and where a surface electrode 57 and a wire are formed. The basic configuration of a bimorph type piezoelectric element is prepared.

Figure 5I:
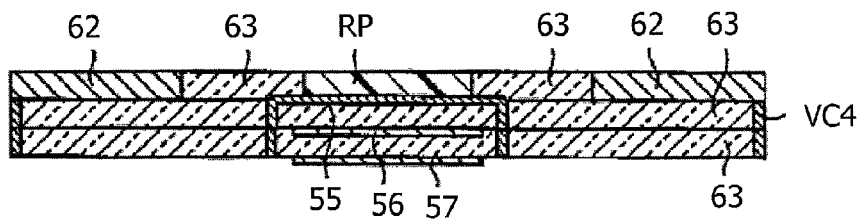

FIG. 5I illustrates a state where a central electrode 56 is formed on the lower surface of the configuration in FIG. 5G, where a piezoelectric material layer green sheet 63 is laminated on the lower surface of a piezoelectric material layer 63 by covering the central electrode 56, and where a surface electrode 57 and a wire are formed. Similarly to FIG. 5H, the basic configuration of a bimorph type piezoelectric element is prepared. In this regard, it is also possible to prepare a lamination configuration portion without forming a bimorph structure in advance. It is possible to change lamination structure fabrication processes in various ways.

Figure 5J:
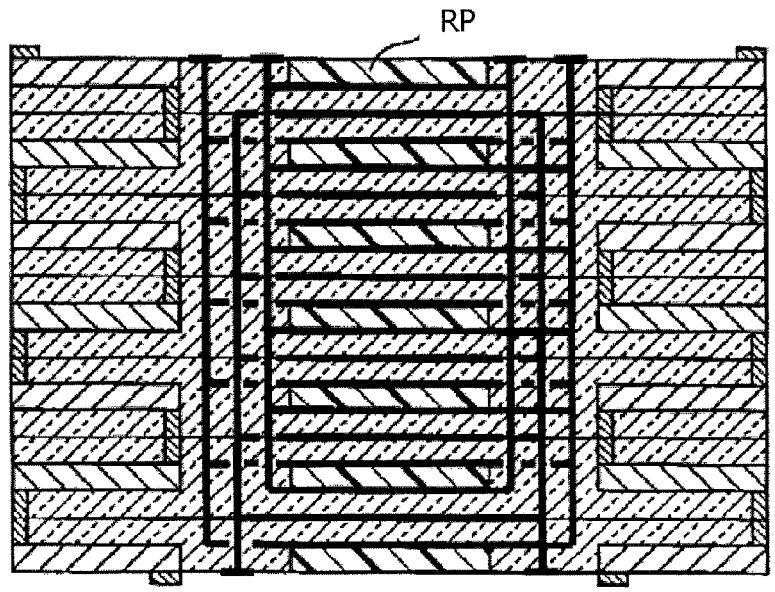

As illustrated in FIG. 5J, a plurality of green sheets wherein a configuration required for forming an electric power generation device is formed, are aligned and laminated. The laminated structure is integrated by means of hot pressing, resulting in a laminated body being formed.

Figure 5K:
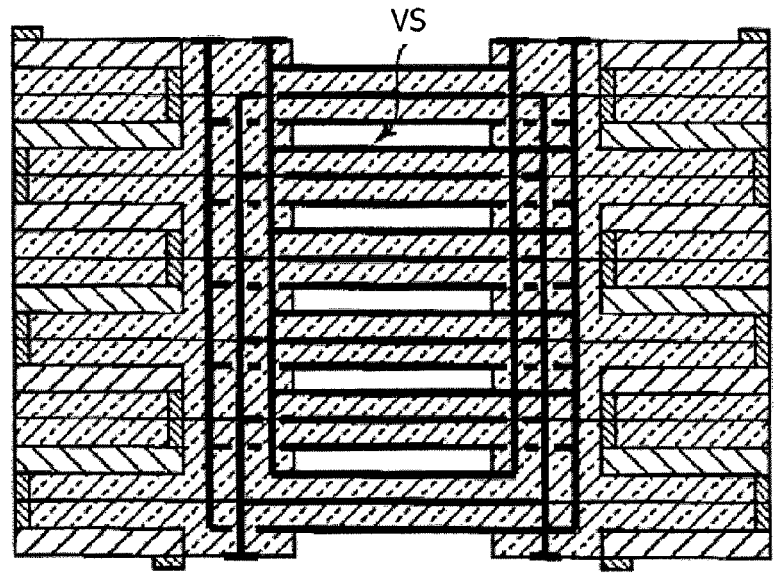

As illustrated in FIG. 5K, the laminated body is degreased in the atmosphere, and is calcined, resulting in a sintered body being obtained. During this process, the resin paste RP is decomposed, scattered, or burned, thereby disappearing. Vacant spaces VP remain in places which used to be occupied by the resin paste RP. The vacant spaces form gaps between piezoelectric elements.

Figure 5L:
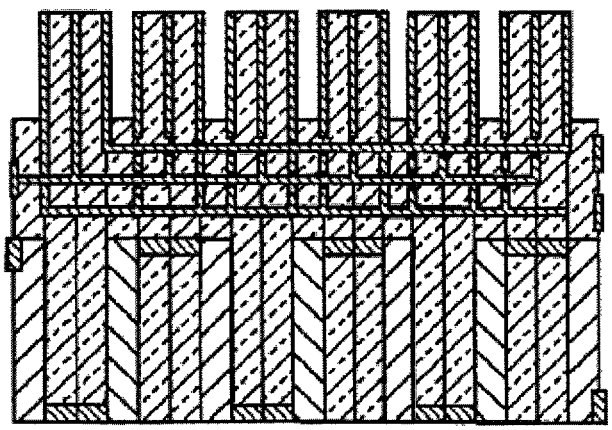

As illustrated in FIG. 5L, the sintered body is cut off into individual piezoelectric power generation devices. The height of the electric power generation devices is in the range of 5 mm to 10 mm, for example.

Figure 5M:
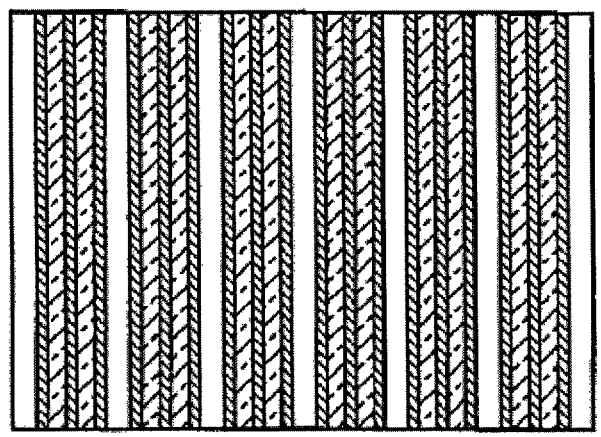

FIG. 5M illustrates a plan view. In FIG. 5M, the height (length in FIG. 5L) of the electric power generation devices is in the range of 5 mm to 10 mm, for example. In FIG. 5M, the lateral (lamination-wise) dimension turns out to be a little less than 1 mm, provided that the piezoelectric ceramic layers and the thermoelectric ceramic layers are each 50 μm or so. Subsequently, as illustrated in FIG. 4B, the weight 58 is elastically connected to the top of the piezoelectric elements by means of the adhesive layer 59. Thus a bimorph type thermoelectric-piezoelectric power generation device is fabricated. In this regard, when a unimorph type electric power device is to be manufactured, what is to do is to omit unnecessary processes.

Embodiment 3

Figure 6A:
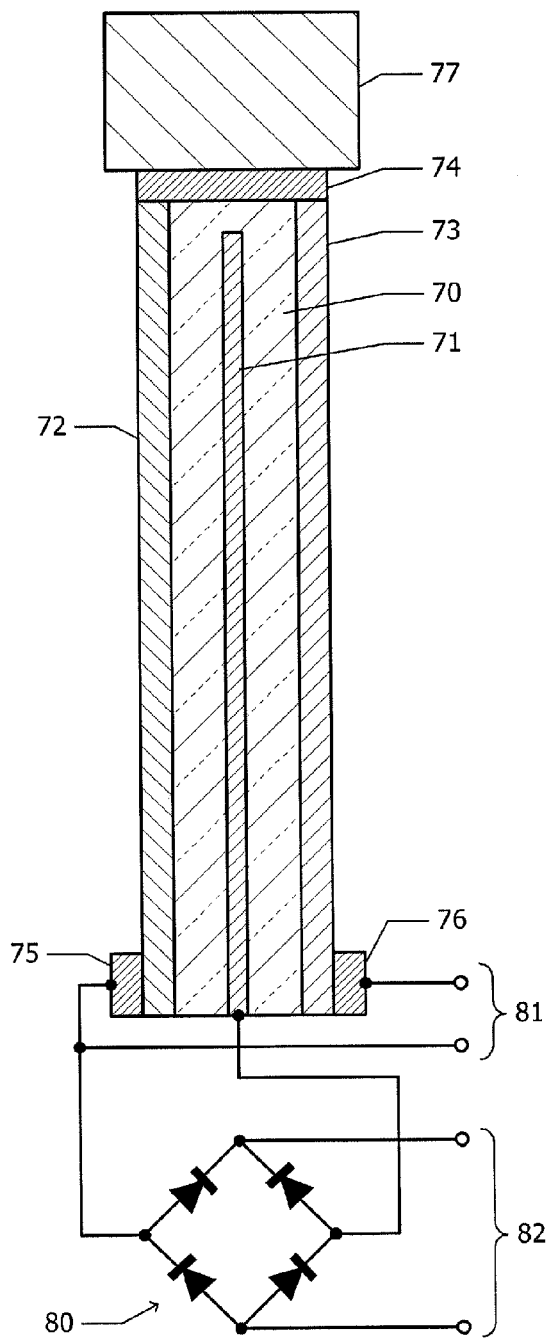
FIG. 6A is a cross-sectional view of an electric power generation device based on Embodiment 3.

FIG. 6A illustrates a cross-sectional view of an electric power generation device based on Embodiment 3. The electric power generation device based on Embodiment 3, too, includes a thermoelectric power generation module and a piezoelectric power generation module, similarly to the electric power generation devices based on Embodiments 1 and 2. The thermoelectric power generation module and the piezoelectric power generation module connect thermally and mechanically to each other. The piezoelectric power generation module includes piezoelectric members wherein deformation occurs due to vibrations of the thermoelectric power generation module.

An inside conductive film 71 is disposed between a pair of piezoelectric material plates 70. One end (the lower end in FIG. 6A) of the piezoelectric material plates 70 serves as a fixed end. The end (the upper end in FIG. 6A) opposite to the fixed end serves as a movable end. The inside conductive film 71 is exposed to the end face on the side of the fixed end. At the movable end, the piezoelectric material plates 70 are continuous with each other.

Outside conductive films 72 and 73 are disposed, respectively, on the outer surfaces of the pair of piezoelectric material plates 70. If a comparison is made between the electric power generation device based on Embodiment 3 and the piezoelectric element which is based on Embodiment 1 and is illustrated in FIG. 2, it follows that the piezoelectric material plates 70, the inside conductive film 71, and the outside conductive films 72 and 73, which are based on Embodiment 3, correspond, respectively, to the piezoelectric material plates 42, the inside conductive film 41, and the outside conductive films 44, which are shown in FIG. 2. A bimorph type piezoelectric element is composed of the piezoelectric material plates 70, the inside conductive film 71, and the outside conductive films 72 and 73.

Electrodes 75 and 76 are mounted on the fixed ends of the outside conductive films 72 and 73, respectively. The outside conductive films 72 and 73 are connected to each other by a conductive member 74 at the movable end of the piezoelectric material plates 70. A weight 77 is mounted on the movable end of the piezoelectric material plates 70. The weight 77 is, for example, soldered to the conductive member 74.

Figure 6B:
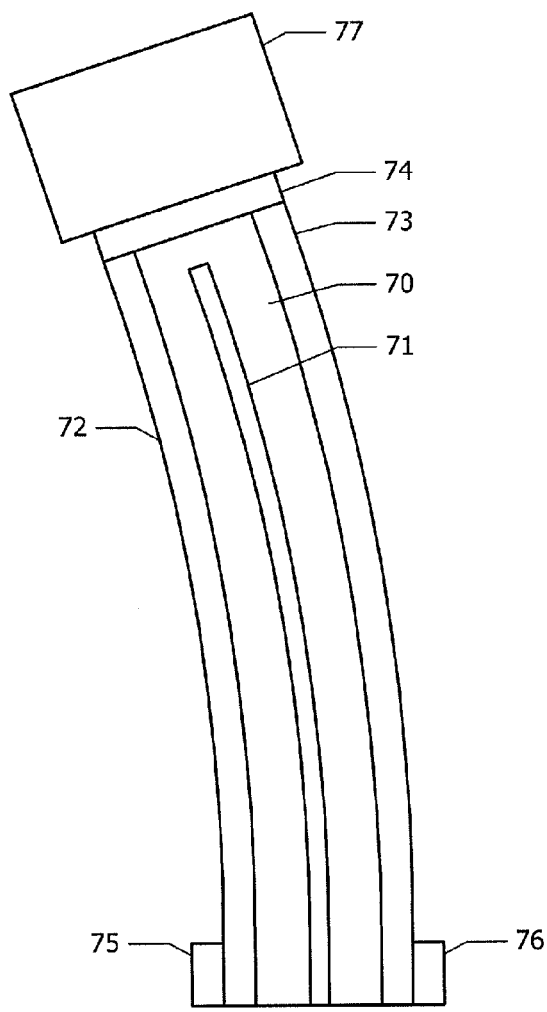
FIG. 6B is the electric power generation device in a bent state.

As illustrated in FIG. 6B, if the movable end of the piezoelectric material plates 70 undergoes displacement with respect to the fixed end, strains are generated in the piezoelectric material plates 70. Due to these strains, a voltage is generated between the outside conductive films 72 and 73.

The explanation will be continued by returning to FIG. 6A. The inside conductive film 71 and the outside conductive films 72 and 73 are connected to an output terminal 82 via a diode bridge 80. The electromotive force caused by the strains of the piezoelectric material plates 70 are taken out to the outside via the output terminal 82.

The outside conductive film 72, which is one of the outside conductive films, is formed of a p-type thermoelectric material, and the outside conductive film 73, which is the other outside conductive film, is formed of an n-type thermoelectric material. The electrode 75, the outside conductive film 72, the conductive member 74, the outside conductive film 73, and the electrode 76 form a n-type thermoelectric element. If a temperature difference occurs between the fixed end and the movable end, a voltage is generated between the electrode 75 and the electrode 76. The electromotive force caused by thermoelectric conversion is taken out to the outside via an output terminal 81 which is connected to the electrodes 75 and 76.

For example, the materials that are the same as the piezoelectric material and the thermoelectric material which are used in Embodiment 1 and Embodiment 2 can be used as a piezoelectric material and thermoelectric a material, respectively.

Figure 7A:
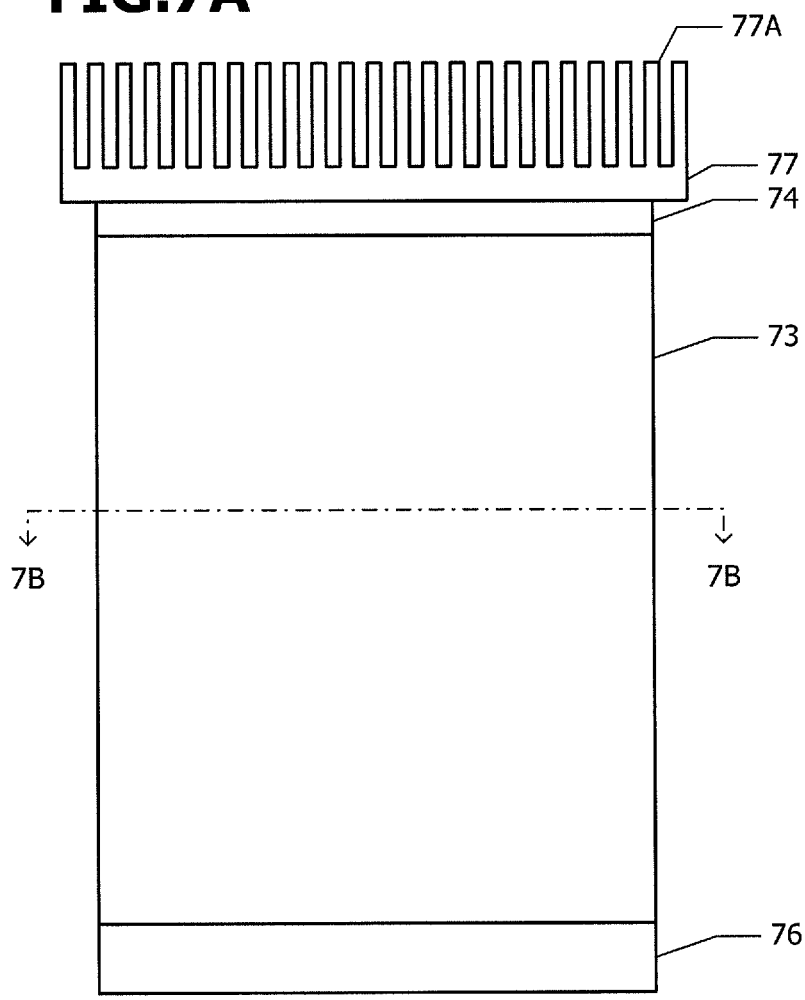
FIG. 7A is a side view of an electric power generation device based on Embodiment 3.

FIG. 7A provides a side view of the electric power generation device which is illustrated in FIG. 6A. The electrode 76 is connected to the fixed end of the outside conductive film 73. The conductive member 74 is connected to the movable end. The weight 77 is mounted on the movable end of the piezoelectric material plates with the conductive member therebetween. A plurality of fins 77A are provided on the weight 77. In a case where the fixed end is connected to a high temperature heat source, a temperature difference occurs between the fixed end and the movable end because heat is radiated from the fins 77A. Furthermore, the weight 77 amplifies the displacement of the movable end caused by the vibrations of the fixed end of the piezoelectric material plates 70.

Figure 7B:
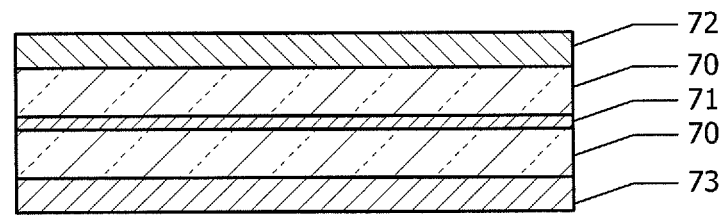
FIG. 7B is a cross-sectional view of FIG. 7A through the dashed-dotted line 7B-7B.

FIG. 7B illustrates a cross-sectional view of FIG. 7A through the dashed-dotted line 7B-7B. The inside conductive film 71 is held between the pair of piezoelectric material plates 70. The outside conductive film 72 is formed on the outer surface of one of the piezoelectric material plates 70. The outside conductive film 73 is formed on the outer surface of the other piezoelectric material plate 70. The inside conductive film 71 is exposed to the end faces on both sides of the piezoelectric material plates 70. In this respect, it is not always necessary to expose the inside conductive film 71.

In the electric power generation device based on Embodiment 3, the outside conductive films 72 and 73 serve also as thermoelectric material layers of thermoelectric elements. Consequently, it becomes possible to take steps to miniaturize the electric power generation device.

Embodiment 4

Figure 8:
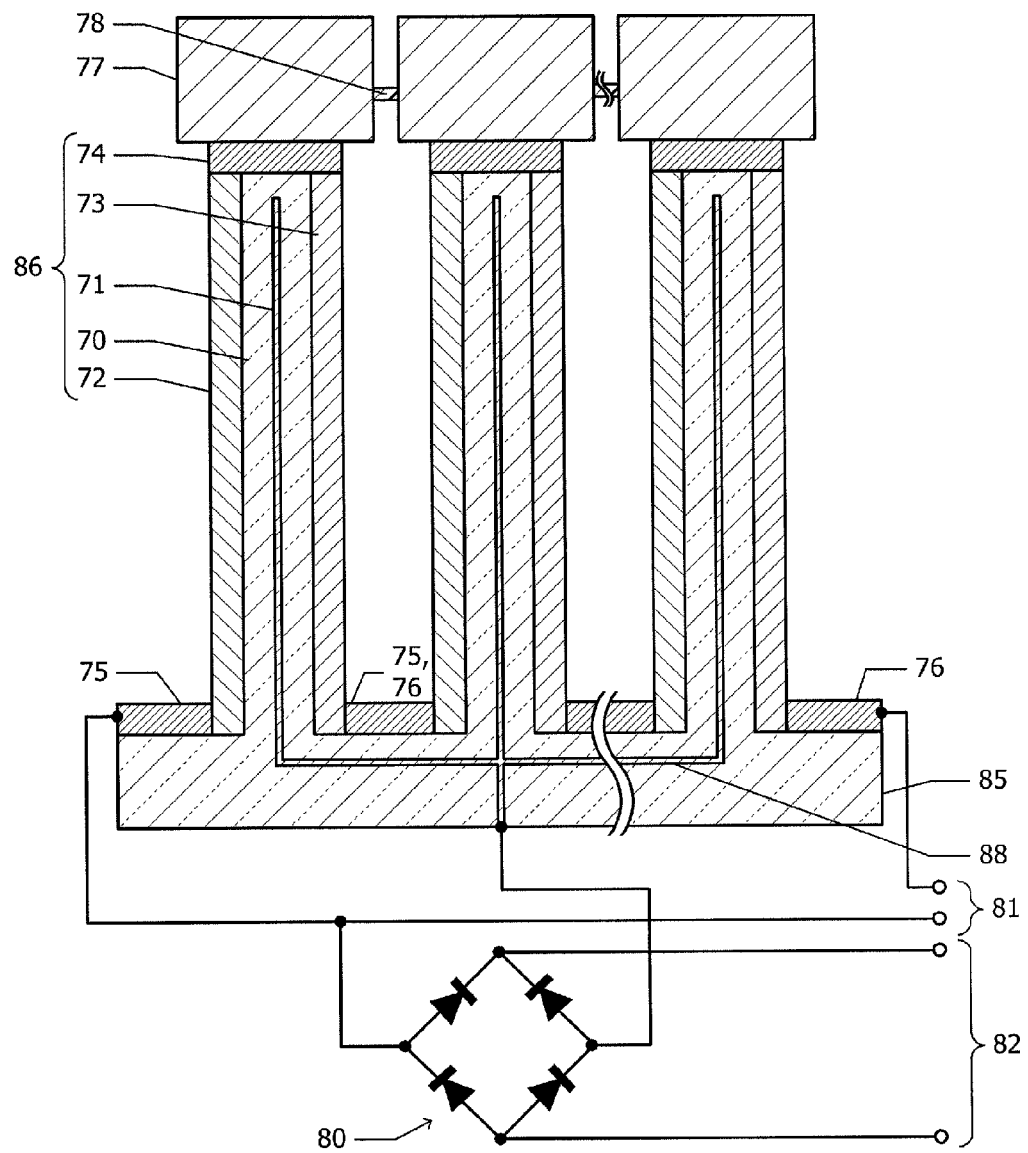
FIG. 8 is a cross-sectional view of an electric power generation device based on Embodiment 4.

FIG. 8 illustrates a cross-sectional view of an electric power generation device based on Embodiment 4. The piezoelectric power generation module of this electric power generation device of Embodiment 4 is equivalent to a configuration wherein three piezoelectric elements which are based on Embodiment 3 and are typically illustrated in FIG. 6A are connected in parallel. The thermoelectric conversion module is equivalent to a configuration wherein three thermoelectric elements which are based on Embodiment 3 and are typically illustrated in FIG. 6A are connected in series.

A plurality of piezoelectric-thermoelectric elements 86 are connected to an insulating base 85. The configuration of each of the piezoelectric-thermoelectric elements 86 is the same as the configuration of the electric power generation device illustrated in FIG. 6A. As regards component parts of the piezoelectric-thermoelectric elements in FIG. 8, the same reference symbols that are assigned to corresponding component parts of the electric power generation device in FIG. 6A, are assigned. The base 85 is formed of the same material as that of the piezoelectric material plates 70. The connection portions between the piezoelectric material plates 70 and the base 85 act as the fixed ends of the piezoelectric-thermoelectric elements 86.

The electrode 76 of one of two mutually adjacent piezoelectric-thermoelectric elements 86 and the electrode 75 of the other adjacent piezoelectric-thermoelectric element 86 are formed of a conductive member to be used in common. Consequently, those portions of the piezoelectric-thermoelectric elements 86 which function as thermoelectric elements are connected in series. The electrode 75 of the piezoelectric-thermoelectric element 86 which is located at one end and the electrode 76 of the piezoelectric-thermoelectric element 86 which is located at other end are connected to the output terminal 81.

A conductive member 88 is embedded in the base 85. The conductive member 88 not only mutually connects the inside conductive films 71 but also is led out to the surface of the base 85. The outside conductive films 72 and 73 of the piezoelectric-thermoelectric elements 86 are mutually connected by the conductive members 74 on the movable end side and by the conductive members which form the electrodes 75 and 76 on the fixed end side. Consequently, those portions of the piezoelectric-thermoelectric elements 86 which function as piezoelectric elements are connected in parallel.

The electrodes 75, which are electrically connected to the outside conductive films 72 and 73, and the conductive member 88, which is embedded in the base 85, are connected to the output terminal 82 via a diode bridge 80.

Weights 77 are mounted on the movable ends of all of the piezoelectric-thermoelectric elements 86. Spacers 78 are disposed between mutually adjacent weights 77. Flexible resin is used for the spacers 78. The spacers 78 constrain the relative positions of the central points of every two adjacent weights 77 so that the center-to-center distances of the weights 77 will not change. However, the spacers 78 have the flexibility to allow changes in the attitude of one of every two adjacent weights 77 with respect the other weight 77.

For example, the base 85 is connected to a heat source on a high temperature side, resulting in a temperature difference being created between the fixed ends and the movable ends. For this reason, thermoelectric power generation is performed. The piezoelectric material plates 70 deforms due to the vibrations of the heat source, resulting in piezoelectric power generation being performed.

Figure 9:
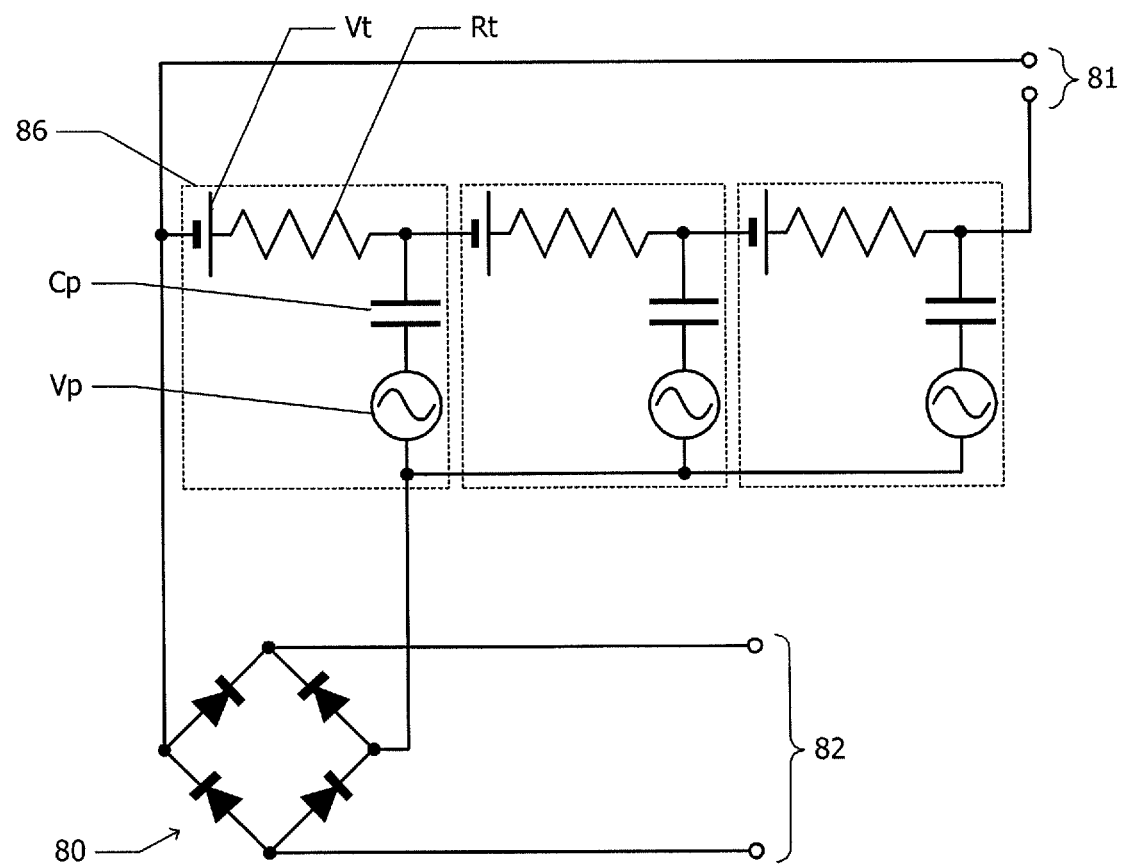
FIG. 9 is an equivalent circuit diagram of the electric power generation device based on Embodiment 4.

FIG. 9 illustrates an equivalent circuit diagram of the electric power generation device illustrated in FIG. 8. Each of the piezoelectric-thermoelectric elements 86 is represented by a four-terminal circuit which includes an direct current power supply Vt and an internal resistor Rt, both of which are compatible with a thermoelectric power generation function, and an alternating current power supply Vp and a capacitor Cp, both of which are compatible with a piezoelectric power generation function. Such four-terminal circuits are cascade-connected. Direct current power supplies Vt are connected in series, with the internal resistors Rt in between. Both ends of this series circuit are connected to the output terminal 81 for a thermoelectric function. A terminal pair of the four-terminal circuit in the first stage is connected to the output terminal 82 for a piezoelectric function via the diode bridge 80.

Figure 10:
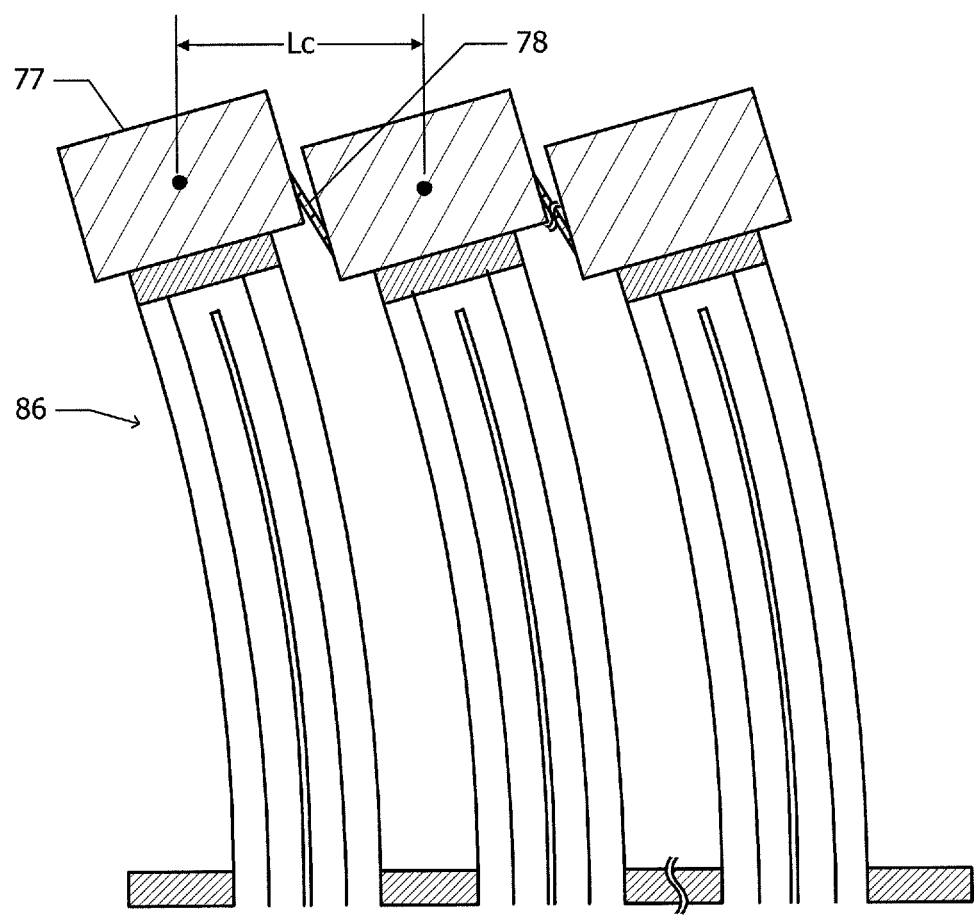
FIG. 10 is a schematic cross-sectional view of the electric power generation device based on Embodiment 4 at a time when the device is bent.

FIG. 10 illustrates a schematic view of a state where the piezoelectric-thermoelectric elements 86 are deformed. Since the spacers 78 connect the weights 77, the center-to-cent distances Lc of the weights 77 do not change. Consequently, it is possible to prevent mutual collision of the weights 77. Furthermore, in all piezoelectric-thermoelectric elements 86, similar deformation occurs in the piezoelectric material plates 70. The alternating current power supplies Vp illustrated in FIG. 9 generate electric voltages of the same phase. Therefore, power generated by piezoelectric effect can be efficiently taken out to the outside.

Figure 11:
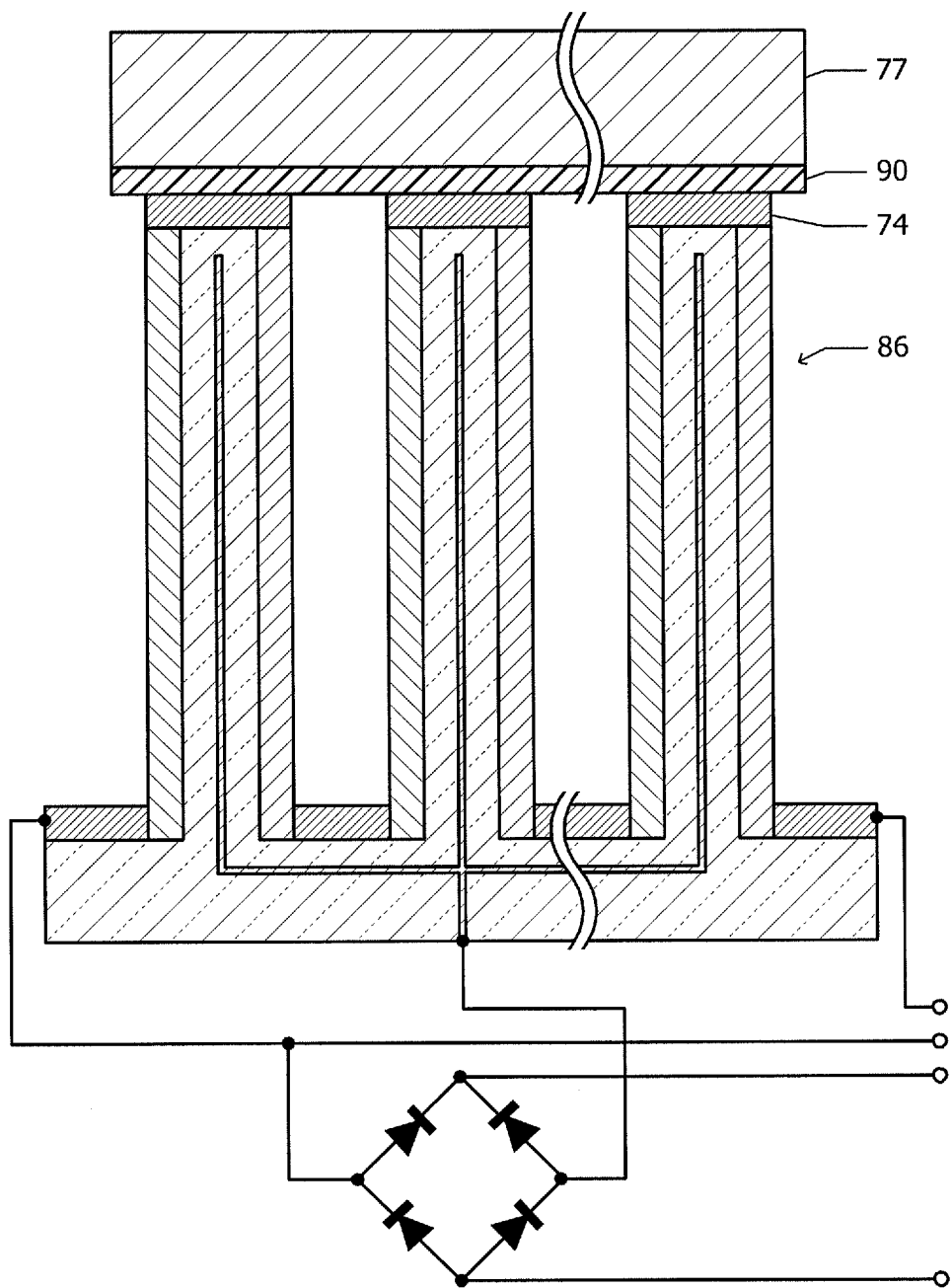
FIG. 11 is a cross-sectional view of an electric power generation device based on a variant example of Embodiment 4.

Furthermore, the spacers 78 allow relative attitude changes of mutually adjacent weights 77. Consequently, the piezoelectric material plates 70 bend in a single direction in the whole regions extending from the fixed ends to the movable ends. Since the bending direction does not reverse, polarizations caused by the piezoelectric effect can be prevented from being cancelled FIG. 11 illustrates a cross-sectional view of an electric power generation device based on a variant example of Embodiment 4. In the following explanation, attention will be focused on the differences from the electric power generation device which are based on Embodiment 4 and are illustrated in FIG. 9 and FIG. 10, with explanations omitted regarding the same configurations.

In Embodiment 4, a weight 77 is mounted on each of the piezoelectric-thermoelectric elements 86. In the variant example, a weight-to-be-used-in-common 77 is mounted on the movable ends of the plurality of piezoelectric-thermoelectric elements 86 by means of a flexible adhesive layer 90. Specifically, the adhesive layer 90 bonds the weight 77 to conductive members 74.

Figure 12:
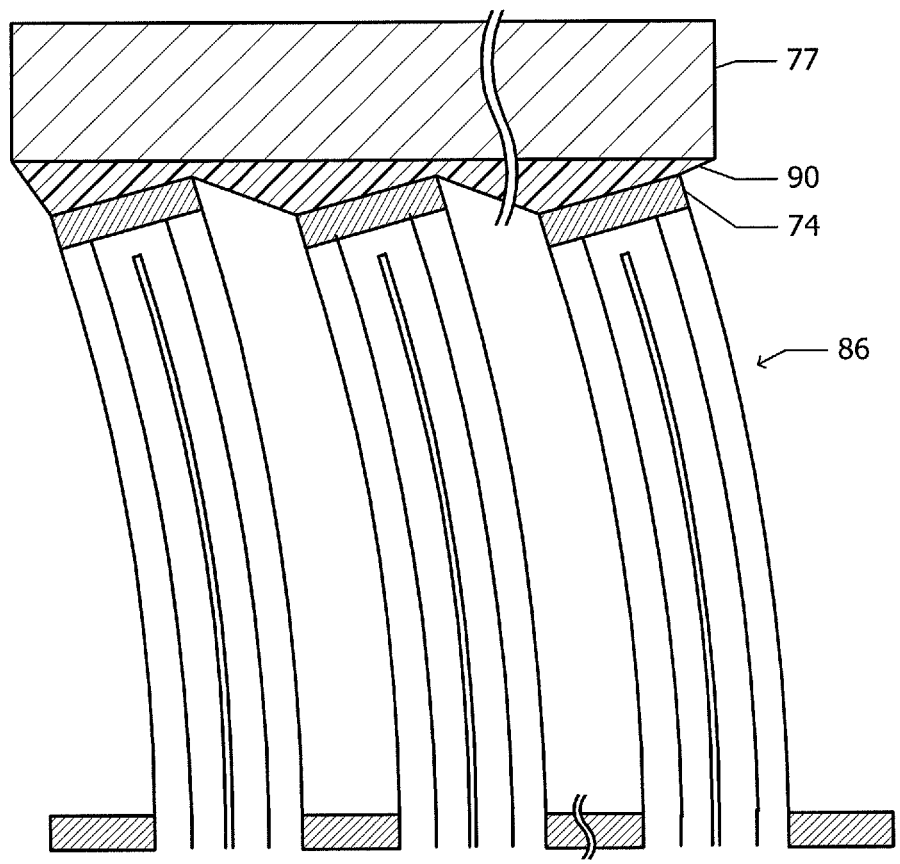
FIG. 12 is a schematic cross-sectional view of the electric power generation device based on the variant example of Embodiment 4 at a time when the device is bent.

FIG. 12 illustrates a cross-sectional view of piezoelectric-thermoelectric elements 86 in a deformed state. The adhesive layer 90 has the flexibility to allow changes in the attitudes of the movable ends of the piezoelectric-thermoelectric elements 86 with respect to the weight 77. Consequently, similarly to the case of Embodiment 4, the piezoelectric-thermoelectric elements 86 bend in a single direction in the whole regions extending from the fixed ends to the movable ends.

In the next place, by making reference to FIG. 13A to FIG. 13P, an explanation will be made of a method of manufacturing the electric power generation device which is based on Embodiment 4 and is illustrated in FIG. 8.

Figure 13A:
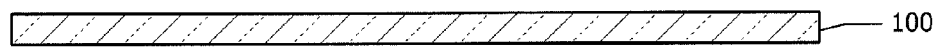
FIG. 13A to FIG. 13O are cross-sectional views of the electric power generation device based on Embodiment 4 in intermediate stages of manufacturing the device.

As illustrated in FIG. 13A, a green sheet 100 which includes piezoelectric ceramic powder is formed. A method which is the same as the method of forming the green sheet 63 is applied to the forming of the green sheet 100, the second above-mentioned method being illustrated in FIG. 5A. The thickness of the green sheet 100 is 50 μm, for example. The planar shape is a square, and the dimensions are 100 mm×100 mm. The green sheet 100 corresponds to a piezoelectric material plate 70 in FIG. 8. FIG. 13A illustrates a portion which corresponds to two electric power generation devices (FIG. 8) which are disposed, with the movable end positions facing each other. In reality, a portion which corresponds to three or more electric power generation devices extends in the lateral direction in FIG. 13A.

Figure 13B:
FIG. 13P is a cross-sectional view of FIG. 13O through the dashed-dotted line 13P-13P.

As illustrated in FIG. 13B, A plurality of 50 μm diameter via holes 101 are formed in the green sheet 100 by means of a punch. The via holes 101 are formed at positions where the conductive member 88 illustrated in FIG. 8 is disposed in the base 85.

Figure 13C:

As illustrated in FIG. 13C, pieces of Ag—Pd conductive paste 102 are filled into the via holes 101.

Figure 13D:
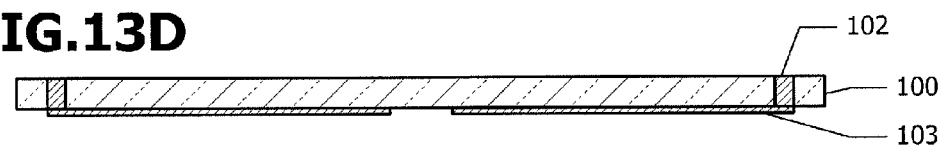

As illustrated in FIG. 13D, Ag—Pd conductive paste is screen-printed on one of the surfaces of the green sheet 100, resulting in inside conductive patterns 103 being formed. The inside conductive patterns 103 correspond to inside conductive patterns 71 (FIG. 8).

Figure 13E:
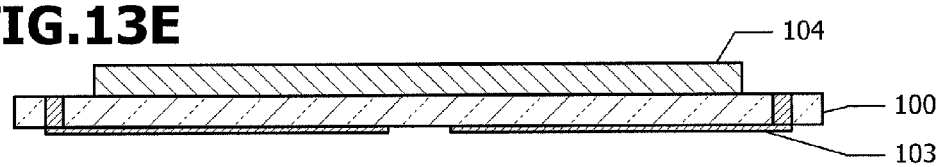

As illustrated in FIG. 13E, p-type thermoelectric material paste is screen-printed on that surface of the green sheet 100 which is opposite to the surface where the inside conductive patterns 103 are formed, with the result that a p-type thermoelectric pattern 104 is formed. The p-type thermoelectric pattern 104 corresponds to an outside conductive film 72 (FIG. 8) formed of p-type thermoelectric material.

Figure 13F:
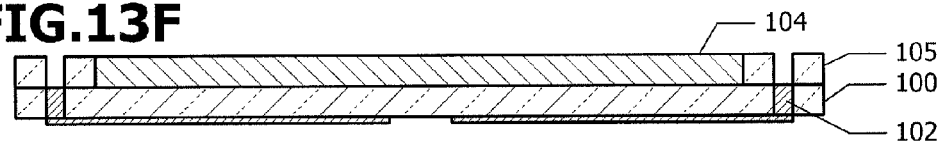

As illustrated in FIG. 13F, paste containing piezoelectric ceramics is screen-printed on the surfaces of those regions of the green sheet 100 which are outside the edges of the p-type thermoelectric pattern 104, resulting in insulating patterns 105 being formed. Openings which are aligned with via holes 101 are provided in the insulating patterns 105. The insulating patterns 105 correspond to a portion of the base 85 (FIG. 8).

Figure 13G:
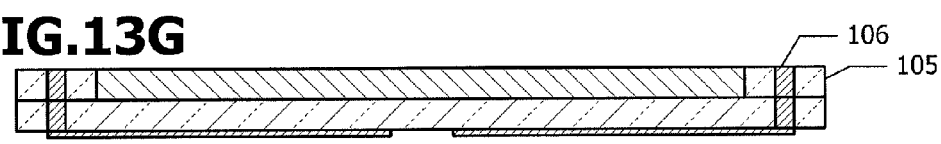

As illustrated in FIG. 13G, pieces of Ag—Pd conductive paste 106 are embedded in the openings in the insulating patterns 105 by means of screen printing. The pieces of Ag—Pd conductive paste 106 correspond to a portion of a conductive member 88 (FIG. 8).

Figure 13H:
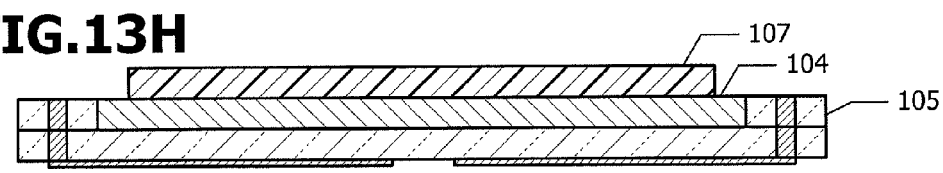

As illustrated in FIG. 13H, resin paste is screen-printed on the p-type thermoelectric pattern 104, resulting in a resin pattern 107 being formed. The resin pattern 107 corresponds to a gap portion between piezoelectric elements 86 illustrated in FIG. 8.

As illustrated in FIG. 13I, paste containing piezoelectric ceramics is screen-printed on the insulating patterns 105, resulting in insulating patterns 108 being formed. The insulating patterns 108 correspond to a portion of the base 85 (FIG. 8). The insulating patterns 108 and the resin pattern 107 are disposed with a gap therebetween. Furthermore, openings that are aligned with the openings in the insulating patterns 105, which are located under the insulating patterns 108, are provided in the insulating patterns 108.

As illustrated in FIG. 13J, Ag—Pd insulating paste is embedded between the resin pattern 107 and the insulating patterns 108, and in the openings provided in the insulating patterns 108, resulting in conductive patterns 109 being formed. The conductive patterns 109 correspond to electrodes 75 or 76 (FIG. 8) and a portion of the conductive member 88.

In the processes performed so far, a first laminated body 120 is fabricated. The first laminated body 120 corresponds to the following items in FIG. 8: an inside conductive film 71, piezoelectric material plates 70, an outside conductive film 72, and a hollow portion outside the outside conductive film 72.

As illustrated in FIG. 13K, a second laminated body 130 is fabricated by a method similar to that for the first laminated body 120. The second laminated body 130 corresponds to the following items in FIG. 8: piezoelectric material plates 70, an outside conductive film 73, and a hollow portion outside the outside conductive film 73. A resin pattern is disposed in the hollow portion.

As illustrated in FIG. 13L, first laminated bodies 120 and second laminated bodies 130 are alternately stacked up. At this time, the green sheet, which corresponds to a piezoelectric material plate 70, of each of the second laminated bodies 130 is brought into close contact with the inside conductive patterns 103 of the pertinent first laminated body 120. Furthermore, the resin pattern of each of the first laminated bodies 120 is brought into close contact with the resin pattern of the pertinent second laminated body 130.

At least one conductive pattern 103 extends to the end face of a green sheet. Furthermore, via holes which correspond to the via holes illustrated in FIG. 13C are not formed in the insulating patterns 108 of the first laminated body 120 which is disposed in the most outward position. Similarly, no via holes are formed in the corresponding insulating patterns of the second laminated body 130 which is disposed in the most outward position. Hot pressing is performed, with the laminated bodies stacked up.

Figure 13M:
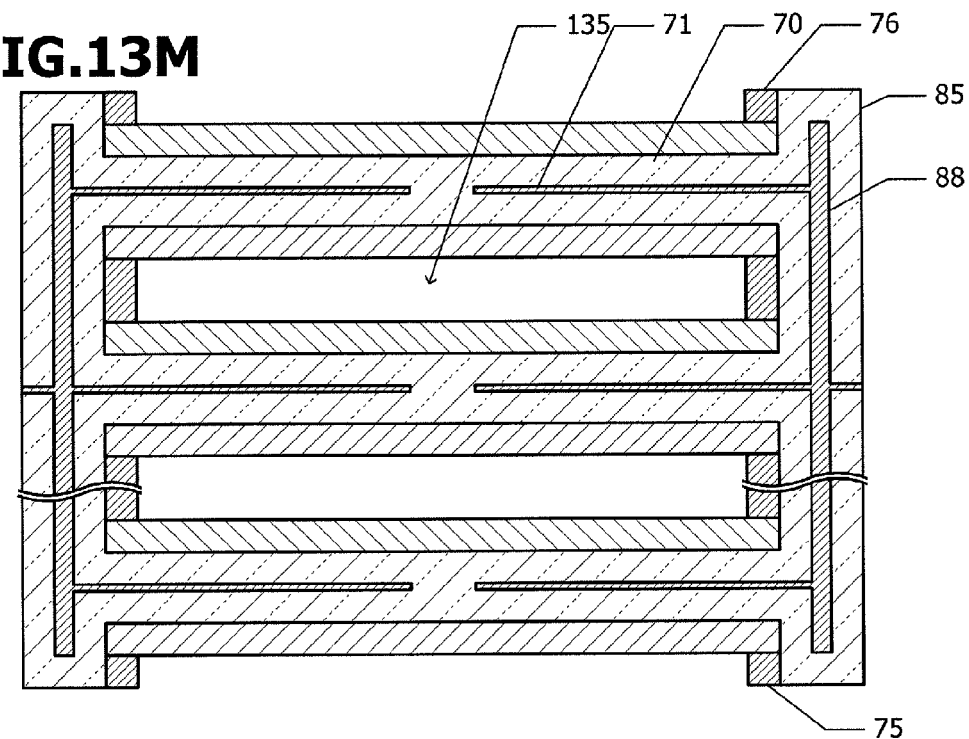

As illustrated in FIG. 13M, degreasing is performed in the atmosphere, and subsequently, calcination is performed. During this process, the resin patterns are decomposed, scattered, or burned, thereby disappearing. Vacant spaces 135 are formed in the portions where the resin patterns used to be disposed. Pieces of Ag—Pd conductive paste 102, inside conductive patterns 103, and conductive patterns 109, etc. are calcined, resulting in inside conductive films 71, electrodes 75 and 76, and conductive members 88 being formed. Green sheets 100 etc. are calcined, resulting in piezoelectric material plates 70 being formed. Furthermore, items such as insulating patterns 105 and 108 are calcined, resulting in a base 85 being formed.

Figure 13N:
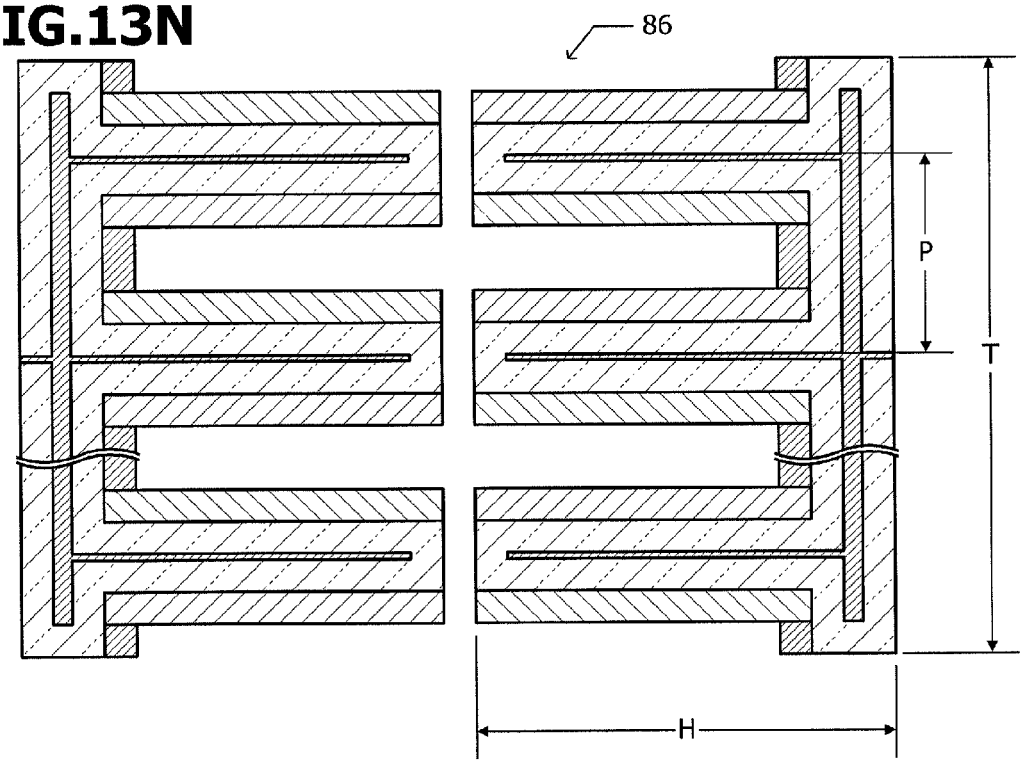

As illustrated in FIG. 13N, the resulting sintered body is cut off with a dicing saw or the like, thereby being divided into individual electric power generation devices. The height H of an electric power generation device is approximately 1 mm. The stack-wise dimension (thickness) T is approximately 10 mm. The dimension (width) perpendicular to the plane of paper on which FIG. 13N is drawn, is approximately 10 mm. The lamination-wise repetition period is approximately 200 µm. The lamination-wise repeat cycle length is approximately 200 µm.

Figure 13O:
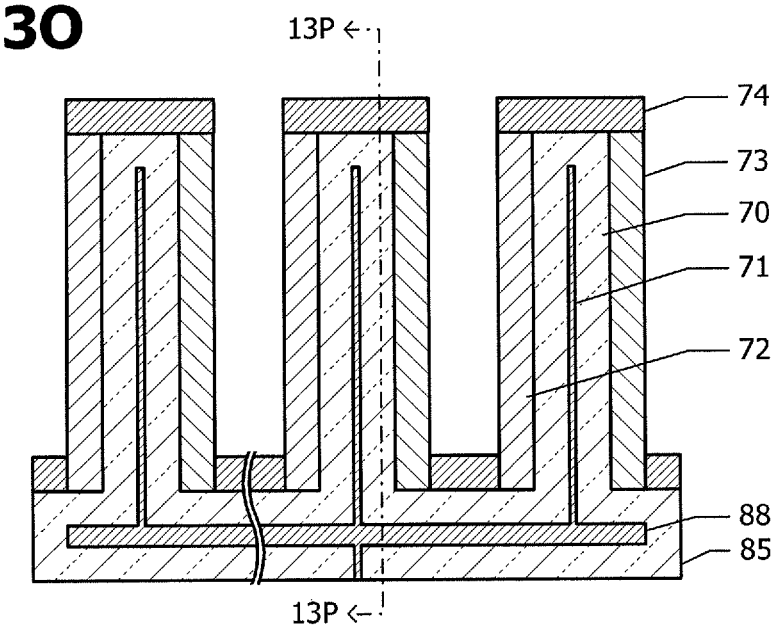

As illustrated in FIG. 13O, conductive members 74 are formed at the tips of piezoelectric material plates 70 and outside conductive films 72 and 73, resulting in outside conductive films 72 and 73 being electrically connected to each other. It is possible to form the conductive members 74, for example, by first screen-printing Ag—Pd paste and by subsequently performing calcination.

Figure 13P:
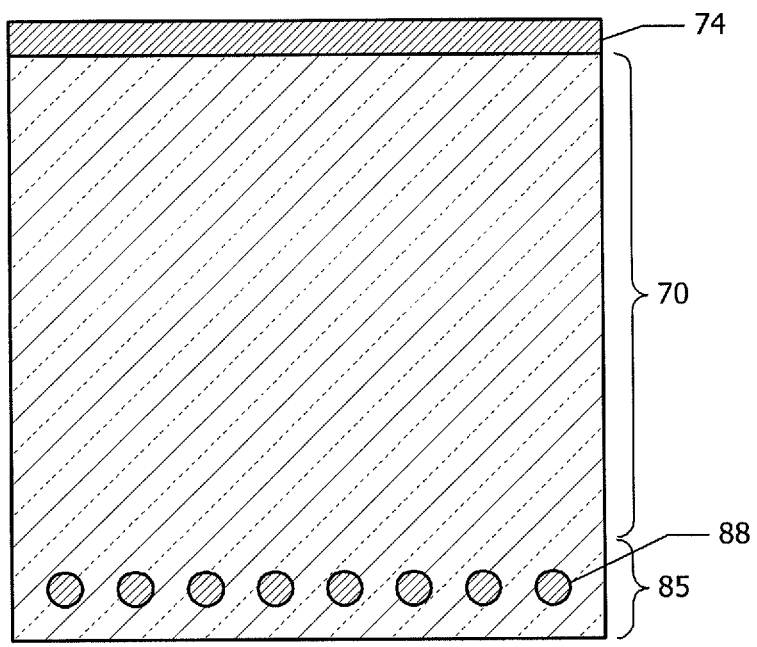

FIG. 13P illustrates a cross-sectional view of FIG. 13O through the dashed-dotted line 13P-13P. Conductive members 88 are embedded in the base 85. The conductive members 88 are disposed at positions which correspond to via holes 101 illustrated in FIG. 13B. In the last place, weights 77 illustrated in FIG. 8 are mounted.

Embodiment 5

By making reference to FIG. 14A to FIG. 14F, an explanation will be made of a method of manufacturing an electric power generation device based on Embodiment 5. In the following explanation, attention will be focused on the differences from the manufacturing method illustrated in FIG. 13A to FIG. 13P, with explanations omitted regarding the same configurations.

Figure 14A:
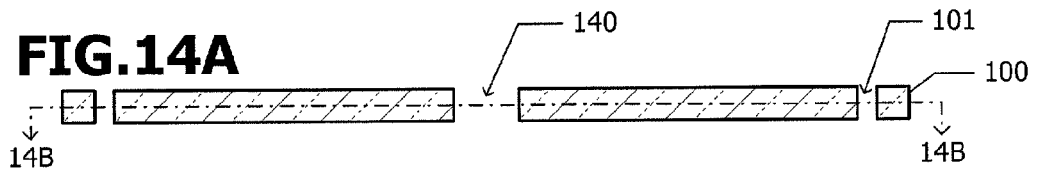
FIG. 14A is a cross-sectional view of an electric power generation device based on Embodiment 5 in an intermediate stage of manufacturing the device.
Figure 14B:
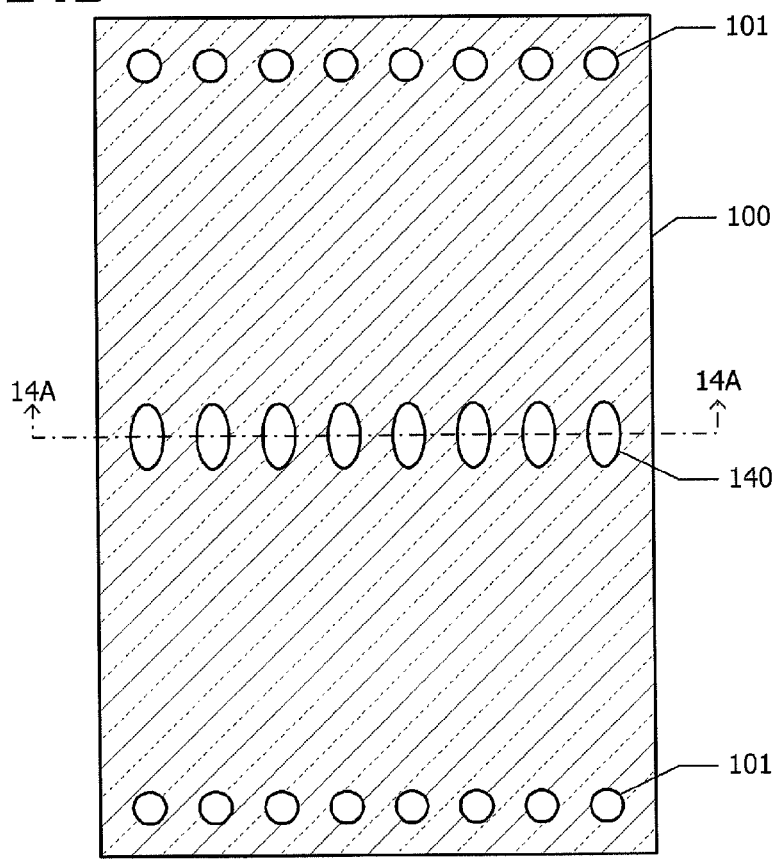
FIG. 14B is a cross-sectional view of FIG. 14A through the dashed-dotted line 14B-14B.

As illustrated in FIG. 14A, a plurality of via holes 101 and a plurality of via holes 140 in a green sheet 100. FIG. 14B illustrates a cross-sectional view of FIG. 14A through the dashed-dotted line 14B-14B. The green sheet 100 is the same as the green sheet 100 illustrated in FIG. 13A. In Embodiment 5, the via holes 140 are formed in addition to via holes 101. The via holes 140 are discretely disposed at positions which correspond to the tips of the piezoelectric elements 86 illustrated in FIG. 8.

Figure 14C:
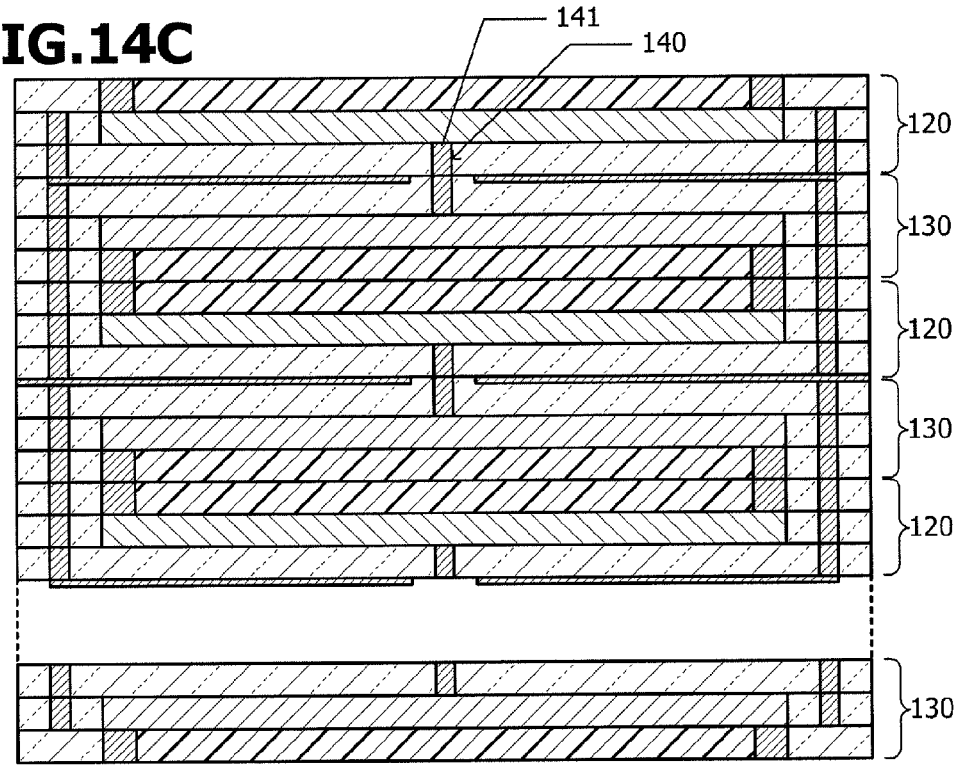
FIG. 14C to FIG. 14E are cross-sectional views of the electric power generation device based on Embodiment 5 in intermediate stages of manufacturing the device.

FIG. 14C illustrates a cross-sectional view of the electric power generation device in the same stage as the stage illustrated in FIG. 13L. Pieces of conductive paste 141 are filled in the via holes 140.

Figure 14D:
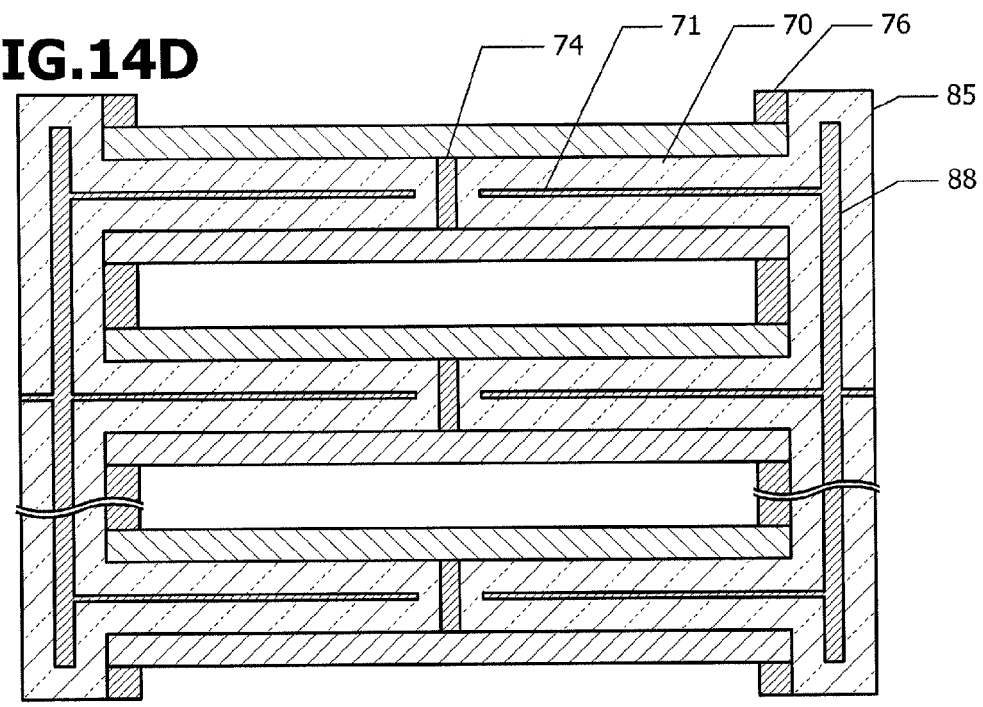

FIG. 14D illustrates a cross-sectional view of the electric power generation device in the same stage as the stage illustrated in FIG. 13M. Pieces of conductive paste 141 are calcined, resulting in conductive members 74 being formed.

Figure 14E:
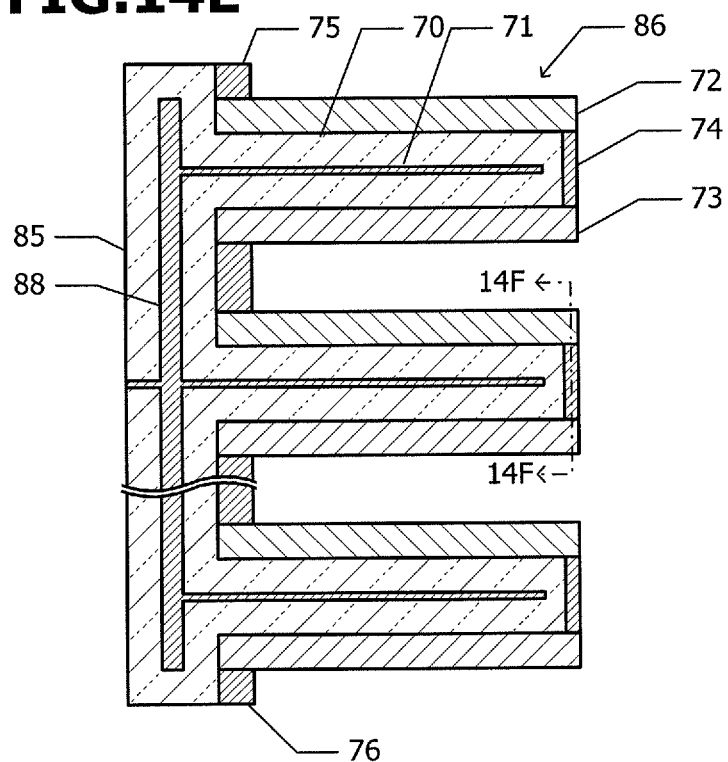

As illustrated in FIG. 14E, the resulting sintered body is cut off with a dicing saw or the like. At this point in time, the conductive members 74, which connect outside conductive films 72 and 73 to each other, are already formed. Consequently, the screen-printing process illustrated in FIG. 13O is not required.

Figure 14F:
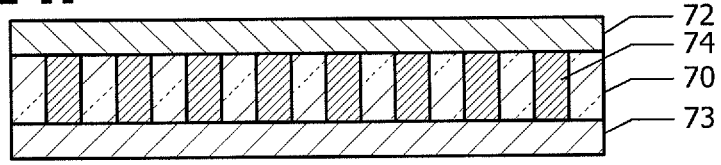
FIG. 14F is a cross-sectional view of FIG. 14E through the dashed-dotted line 14F-14F.

FIG. 14F illustrates a cross-sectional view of FIG. 14E through the dashed-dotted line 14F-14F. In the example illustrated in FIG. 13O, the conductive members 74 covers the entire regions of the movable ends (tips) of the piezoelectric-thermoelectric elements 86. However, in Embodiment 5, the conductive members 74 are discretely distributed in the width direction.

In Embodiment 5, the conductive members 74 at the tips of the piezoelectric-thermoelectric elements 86 are formed at the same time as the electrodes 75 and 76 and the inside conductive films 71 on the fixed end side and as the conductive members 88 in the base 85. Consequently, it is possible to reduce the number of manufacturing processes, compared to the manufacturing method illustrated in FIG. 13A to FIG. 13P.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What are claimed are:

1. An electric power generation device equipped with an apparatus which vibrates and whose temperature is higher than ambient temperature comprising:
   a thermoelectric power generation module which includes a thermoelectric element made of a semiconductor material and has a first surface combining thermally and mechanically with the apparatus's outer surface and a second surface opposite to the first surface, and which generates electric power from temperature differences between the first surface and the second surface; and
   a piezoelectric power generation module which has a fixed end combining mechanically with the apparatus's outer surface and a movable end opposite to the fixed end, and which generates electric power from displacement of the movable end to the fixed end, whose direction is parallel to the apparatus's outer surface;
   wherein the thermoelectric power generation module and the piezoelectric power generation module are formed integrally.

2. An electric power generation device as set forth in claim 1, wherein the piezoelectric power generation module is formed over the second surface of the thermoelectric power generation module, and combines mechanically with the apparatus's outer surface via the thermoelectric power generation module.

3. An electric power generation device as set forth in claim 2, wherein:
   the piezoelectric power generation module includes radiation fins each of which has a combination end combining thermally and mechanically with the second surface of the thermoelectric power generation module and a open end opposite to the combination end;
   each of the radiation fins includes:
   an inside conductive film deposited at an angle intersecting a plane parallel to the second surface of the thermoelectric power generation module,
   a pair of piezoelectric material plates surrounding the inside conductive film, and
   an outside conductive film surrounding the pairing piezoelectric material plates; and
   the combination ends of the radiation fins constitute the fixed end of the piezoelectric power generation module, and the open ends of the radiation fins constitute the movable end of the piezoelectric power generation module.

4. An electric power generation device as set forth in claim 3, further comprising a seat which is deposited between the thermoelectric power generation module and the piezoelectric power generation module, and which combines thermally and mechanically with the thermoelectric power generation module,
wherein:
   the radiation fins are fixed to the seat at the combination ends;
   the outside conductive films of the radiation fins cover continuously areas extending from the surfaces of the pairing piezoelectric material plates to the surface of the seat.

5. An electric power generation device as set forth in claim 3, wherein the pairing piezoelectric material plates have residual polarizations which are oriented to the same direction in the thickness direction.

6. An electric power generation device as set forth in claim 2, wherein:
   the piezoelectric power generation module includes piezoelectric elements each of which has a piezoelectric material plate and an outside conductive film surrounding the piezoelectric material plate;
   the piezoelectric elements are arranged along the in-plane direction of the second surface of the thermoelectric power generation module with gaps, one ends of the piezoelectric elements combining mechanically with the thermoelectric power generation module and constituting the fixed end of the piezoelectric power generation module, the other ends constituting the movable end;
   the thermoelectric power generation module includes a thermoelectric element which has thermoelectric material layers and insulating layers formed of piezoelectric materials, the thermoelectric material layers and the insulating layers being laminated alternately along the in-plane direction of the apparatus's outer surface, one side surface of the thermoelectric element constituting the first surface of the thermoelectric power generation module, the other side surface constituting the second surface; and
   the insulating layers of the thermoelectric element extend to the piezoelectric power generation module over the second surface of the thermoelectric power generation module, and constitute the piezoelectric material plates of the piezoelectric elements.

7. An electric power generation device as set forth in claim 6, wherein:
   the thermoelectric material layers of the thermoelectric element include p-type thermoelectric layers having p-type conductivity and n-type thermoelectric layers having n-type conductivity which are arranged alternately and sandwich the insulating layers; and
   the gaps defined by the piezoelectric elements are deposited over the p-type thermoelectric layers and the n-type thermoelectric layers.

8. An electric power generation device as set forth in claim 6, wherein each of the piezoelectric elements includes an inside conductive film embedded in and surrounded by the piezoelectric material plate, and constitutes a bimorph type piezoelectric element.

9. An electric power generation device as set forth in claim 8, wherein the outside conductive film has a larger thickness than that of the inside conductive film, and function also as a heat transfer layer for the thermoelectric material layer.

10. An electric power generation device as set forth in claim 6, further comprising a weight which is connected to the other ends of the piezoelectric elements, with flexible adhesive in between.

11. An electric power generation device as set forth in claim 1, wherein:

the first surface of the thermoelectric power generation module and the fixed end of the piezoelectric power generation module are formed integrally; and the second surface of the thermoelectric power generation module and the movable end of the piezoelectric power generation module are formed integrally.

12. An electric power generation device as set forth in claim 11, wherein:
the thermoelectric power generation module includes a thermoelectric element which has one end face near the apparatus's outer surface constituting the first surface of the thermoelectric power generation module and the other end face far the apparatus's outer surface constituting the second surface;
the thermoelectric element includes:
a pair of thermoelectric material layers, one of the pairing thermoelectric material layers which is formed of a p-type thermoelectric layer having p-type conductivity, the other which is formed of a n-type thermoelectric layer having n-type conductivity, the pairing thermoelectric material layers being arranged along the in-plane direction of the apparatus's outer surface, and
a conductive member connecting electrically the p-type thermoelectric layer and the n-type thermoelectric layer to each other at the other end face;
the piezoelectric power generation module includes a piezoelectric element which has one end near the apparatus's outer surface constituting the fixed end of the piezoelectric power generation module and the other end far the apparatus's outer surface constituting the movable end;
the piezoelectric element includes:
an inside conductive film deposited at an angle intersecting a plane parallel to the apparatus's outer surface,
a pair of piezoelectric material plates surrounding the inside conductive film, and
a pair of outside conductive films surrounding the pairing piezoelectric material plates; and
the pair of outside conductive films of the piezoelectric element constitutes the pair of thermoelectric material layers of the thermoelectric element.

13. An electric power generation device as set forth in claim 11, wherein:
the thermoelectric power generation module includes:
thermoelectric elements each of which has one end face near the apparatus's outer surface constituting the first surface of the thermoelectric power generation module and the other end face far the apparatus's outer surface constituting the second surface, and
first conductive members connecting electrically the thermoelectric elements to each other;
each of the thermoelectric elements includes:
a pair of thermoelectric material layers, one of the pairing thermoelectric material layers which is formed of a p-type thermoelectric layer having p-type conductivity, the other which is formed of a n-type thermoelectric layer having n-type conductivity, the pairing thermoelectric material layers being arranged along the in-plane direction of the apparatus's outer surface, and a second conductive member connecting electrically the p-type thermoelectric layer and the n-type thermoelectric layer to each other at the other end face;
the mutually adjacent thermoelectric elements are deposited so that the p-type thermoelectric layer and the n-type thermoelectric layer face to each other;
each of the first conductive members connects electrically the facing p-type thermoelectric layer and n-type thermoelectric layer to each other at the one end face;
the piezoelectric power generation module includes piezoelectric elements each of which has one end near the apparatus's outer surface constituting the fixed end of the piezoelectric power generation module and the other end far the apparatus's outer surface constituting the movable end, the piezoelectric elements being arranged along the in-plane direction of the apparatus's outer surface with gaps;
each of the piezoelectric elements includes:
an inside conductive film deposited at an angle intersecting a plane parallel to the apparatus's outer surface,
a pair of piezoelectric material plates surrounding the inside conductive film, and
a pair of outside conductive films surrounding the pairing piezoelectric material plates; and
the pairs of outside conductive films of the piezoelectric elements constitute the pairs of thermoelectric material layers of the thermoelectric elements.

14. An electric power generation device as set forth in claim 13, further comprising:
weights mounted on each of the piezoelectric elements at the other end; and
spacers connecting mechanically the mutually adjacent weights to each other, fixing relative positions between central points of the mutually adjacent weights, and allowing relative attitude changes of the mutually adjacent weights.

15. An electric power generation device as set forth in claim 14, wherein the weights include heat exchange fins.

16. An electric power generation device as set forth in claim 13, further comprising a weight mounted on the piezoelectric elements at the other ends with adhesive, wherein the adhesive has flexibility to allow changes in the attitude of the other ends of the piezoelectric elements with respect to the attitude of the weight.

17. An electric power generation device as set forth in claim 16, wherein the weight includes heat exchange fins.

18. An electric power generation method comprising:
generating thermoelectric power by equipping a thermoelectric conversion material which is provided with radiation fins with an apparatus which vibrates and whose temperature is hither than ambient temperature the thermoelectric conversion material being disposed on an outer surface of the apparatus; and
generating piezoelectric power from deformation of a piezoelectric conversion material which forms a portion of the radiation fins, the deformation being caused by vibrations of the apparatus and arising in a direction parallel to the outer surface of the apparatus.

* * * * *